US009613247B2

(12) United States Patent
Yang

(10) Patent No.: US 9,613,247 B2
(45) Date of Patent: Apr. 4, 2017

(54) SENSING METHOD AND CIRCUIT OF FINGERPRINT SENSOR

(71) Applicant: ELAN MICROELECTRONICS CORPORATION, Hsinchu (TW)

(72) Inventor: Chao-Chi Yang, Hsinchu (TW)

(73) Assignee: ELAN MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/960,847

(22) Filed: Dec. 7, 2015

(65) Prior Publication Data

US 2016/0171272 A1 Jun. 16, 2016

Related U.S. Application Data

(60) Provisional application No. 62/092,225, filed on Dec. 15, 2014, provisional application No. 62/116,885, filed on Feb. 16, 2015.

(30) Foreign Application Priority Data

Nov. 9, 2015 (TW) .............................. 104136842 A

(51) Int. Cl.
*G01R 27/26* (2006.01)
*G06K 9/00* (2006.01)
(Continued)

(52) U.S. Cl.
CPC ............. *G06K 9/0002* (2013.01); *G01D 5/24* (2013.01); *G01R 27/2605* (2013.01);
(Continued)

(58) Field of Classification Search
CPC ........ G01D 5/24; G01D 5/241; G01D 5/2412; G01D 5/2417; G01R 27/26; G01R 27/2605;
(Continued)

(56) References Cited

U.S. PATENT DOCUMENTS 6,346,739 B1 * 2/2002 Lepert ................ G06K 9/00053
257/532
6,411,727 B1 6/2002 Harkin
(Continued)

FOREIGN PATENT DOCUMENTS

CN 101173578 A 5/2008
CN 101666832 A 3/2010
(Continued)

*Primary Examiner* — Hoai-An D Nguyen
(74) *Attorney, Agent, or Firm* — patenttm.us

(57) ABSTRACT

A sensing method and circuit of fingerprint sensor is disclosed. In a first phase, the sensing method supplies a first to third voltages to an electrode plate to be measured, a read-out circuit of the electrode plate to be measured and a conductor adjacent to the electrode plate to be measured, respectively. In a second phase, the sensing method stops supplying the first to third voltages and supplies voltage to the conductor and connects the electrode plate to be measured to the read-out circuit so the read-out circuit reads out a measurement result of the electrode plate to be measured. According to the sensing method and circuit, the measurement result of the electrode plate to be measured is not affect by capacitors between the electrode plate to be measured and the conductor.

34 Claims, 21 Drawing Sheets

(51) Int. Cl.
*G01D 5/24* (2006.01)
*H03K 17/955* (2006.01)

(52) U.S. Cl.
CPC .......... *G01R 27/26* (2013.01); *G06K 9/00006* (2013.01); *H03K 17/955* (2013.01)

(58) Field of Classification Search
CPC  G06K 9/00006; G06K 9/0002; G06F 3/0414; G01L 1/142; H03K 17/955
USPC ....... 324/519, 548, 600, 647, 649, 658, 660, 324/661, 662, 663, 664, 665, 671, 672, 324/679, 686, 76.11, 98; 702/1, 47, 52; 345/173, 174; 382/100, 115, 116, 124
See application file for complete search history.

(56) References Cited

U.S. PATENT DOCUMENTS

| | | | | |
|---|---|---|---|---|
| 6,922,081 | B2* | 7/2005 | Frey | G01N 27/3277 204/403.14 |
| 2004/0096061 | A1 | 5/2004 | Yano et al. | |
| 2016/0062537 | A1* | 3/2016 | Kim | G06F 3/0416 345/174 |
| 2016/0077030 | A1* | 3/2016 | Stanley | G01N 27/122 324/601 |
| 2016/0171275 | A1* | 6/2016 | Wang | G06K 9/00053 382/124 |

FOREIGN PATENT DOCUMENTS

| | | |
|---|---|---|
| CN | 102768045 A | 11/2012 |
| CN | 203689535 U | 7/2014 |
| CN | 203964928 U | 11/2014 |
| TW | 201015452 A | 4/2010 |
| TW | 201114179 A | 4/2011 |
| TW | 201414987 A | 4/2014 |
| TW | 201439865 A | 10/2014 |

\* cited by examiner

SENSING METHOD AND CIRCUIT OF FINGERPRINT SENSOR

CROSS-REFERENCE TO RELATED APPLICATIONS

This application claims the benefit of United States provisional application filed on Dec. 15, 2014 and having application Ser. No. 62/092,225 and the benefit of United States provisional application filed on Feb. 16, 2015 and having application Ser. No. 62/116,885, the entire contents of which are hereby incorporated herein by reference.

This application is based upon and claims priority under 35 U.S.C. 119 from Taiwan Patent Application No. 104136842 filed on Nov. 9, 2015, which is hereby specifically incorporated herein by this reference thereto.

BACKGROUND OF THE INVENTION

1. Field of the Invention

The present invention relates to a fingerprint sensor, especially to a sensing method and circuit of a fingerprint sensor.

2. Description of the Prior Arts

With reference to FIGS. 12 and 13, a schematic diagram of a projected capacitive fingerprint sensor 50 is shown. The projected capacitive fingerprint sensor 50 has multiple electrode plates 51 arranged in a matrix, a protection electrode 52 and a sensing circuit 53 connected to the electrode plates 51. The sensing circuit 53 is used to detect a capacitance value of a capacitor formed between the finger 60 and each electrode plate 51, such as a capacitor $C_{SA}$ between the finger 60 and the electrode plate (Plate A). According to the capacitance value of the capacitor formed between the finger 60 and each electrode plate 51, a fingerprint image of the finger can be obtained. However, a measurement result of the capacitance value of the capacitor formed between the finger 60 and the electrode plate 51 is affected by other factors. For example, when detecting the electrode plate (Plate A), multiple capacitors respectively formed between the electrode plate (Plate A) and other electrode plates (Plate B~Plate D) around the electrode plate (Plate A), and a capacitor $C_{FAS}$ formed between the electrode plate (Plate A) and the protection electrode 52 (such as an electrostatic discharge protection electrode) also affect the measurement result.

SUMMARY OF THE INVENTION

Based on the aforementioned drawbacks of the prior art, an objective of the present invention provides a sensing method and circuit of a fingerprint sensor.

To achieve the aforementioned objective, the present invention provides the sensing method of the fingerprint sensor having steps of:

(a) in a first phase, supplying a first voltage to a first node connected to an electrode plate to be measured, supplying a second voltage to a second node connected to a read-out circuit, and supplying a third voltage to a conductor adjacent to an electrode plate to be measured, wherein the first voltage minus the second voltage leaves a non-zero value and the first voltage is larger or smaller than the second voltage; and (b) in a second phase, stopping supplying the first, second and third voltages to the first, second and third nodes, supplying a fourth voltage to the conductor, connecting the first node to the second node, wherein a voltage of the second node corresponds to a measurement result of the electrode plate to be measured, wherein when the first voltage is larger the second voltage and the third voltage is larger than the fourth voltage, or when the first voltage is smaller the second voltage and the third voltage is smaller than the fourth voltage.

To achieve the aforementioned another objective, the present invention provides the sensing circuit of the fingerprint sensor having:

a read-out circuit to read out a measurement result of an electrode plate to be measured;

a first switching unit coupling to a first voltage and a second voltage and having a first node connected to the electrode plate to be measured and a second node connected to the read-out circuit, wherein the first voltage minus the second voltage leaves a non-zero value and the first voltage is larger or smaller than the second voltage;

a second switching unit to connect a conductor to a third voltage or a fourth voltage, wherein the third voltage minus the fourth voltage leaves a non-zero value and when the first voltage is larger the second voltage and the third voltage is larger than the fourth voltage, or when the first voltage is smaller the second voltage and the third voltage is smaller than the fourth voltage; and a control unit controlling the first and second switching units, wherein in a first phase, the control unit controls the first and second units to connect the first node to the first voltage, to connect the second node to the second voltage, to disconnect the first node to the second node and to connect the conductor to the third voltage;

in a second phase, the control unit controls the first and second switching units to respectively disconnected the first, second and third nodes to the first, second and third voltages, to connect the first node to the second node and to control the second switching unit to couple the conductor to the fourth voltage.

Based on the foregoing description, the sensing method and circuit of the fingerprint sensor respectively connects the adjacent conductor to the third and fourth voltages with different electric potentials in the first and second phases to improve the drawback of the prior art. The drawback is that an fringe capacitor formed between the electrode plate to be measured and the adjacent conductor affects a measurement result of the electrode plate to be measured.

Other objectives, advantages and novel features of the invention will become more apparent from the following detailed description when taken in conjunction with the accompanying drawings.

DETAILED DESCRIPTION OF THE EMBODIMENTS

Figure 1A:
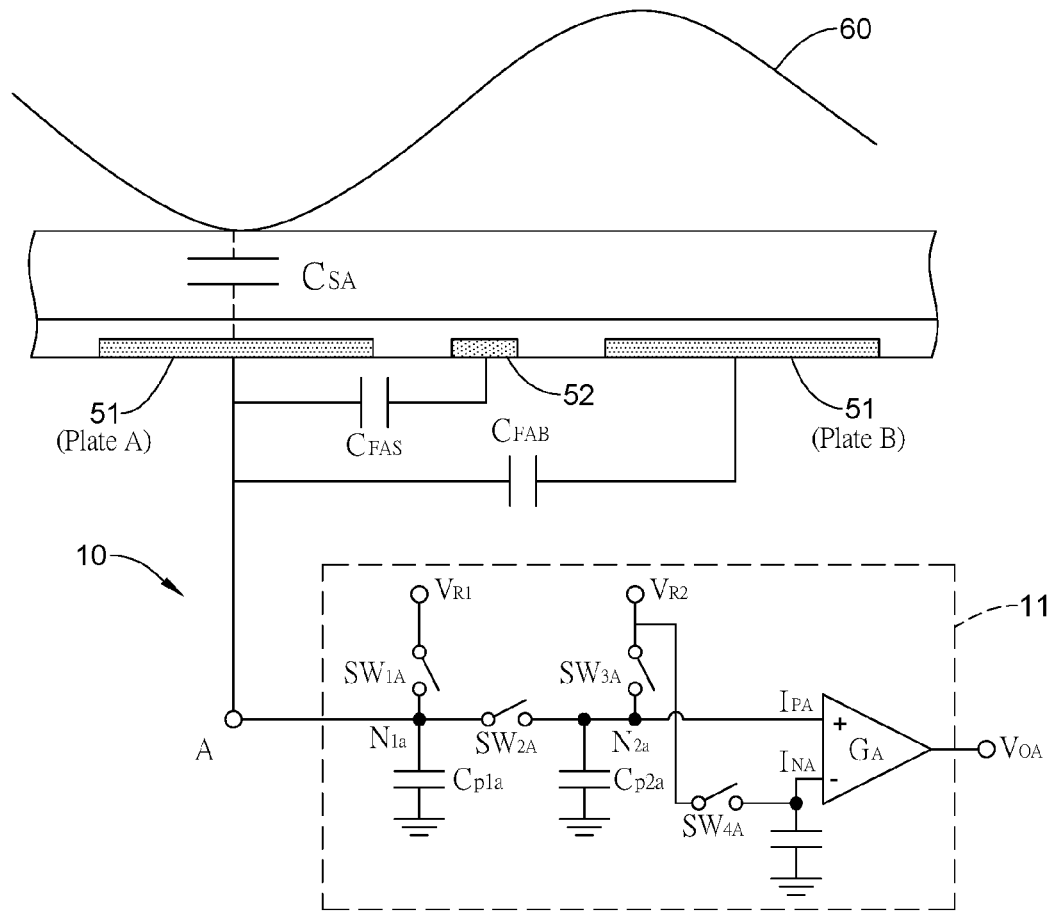
FIG. 1A is a schematic view of a partial structure of a fingerprint sensor and a sensing circuit thereof in accordance with the present invention.
Figure 1B:
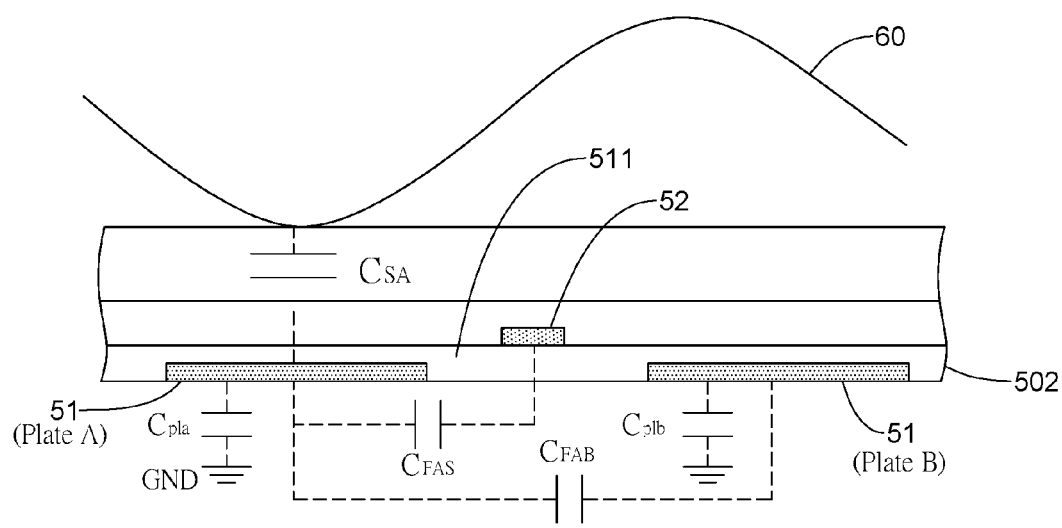
FIG. 1B is another schematic view of a partial structure of a fingerprint sensor and a sensing circuit thereof in accordance with the present invention.
Figure 12:
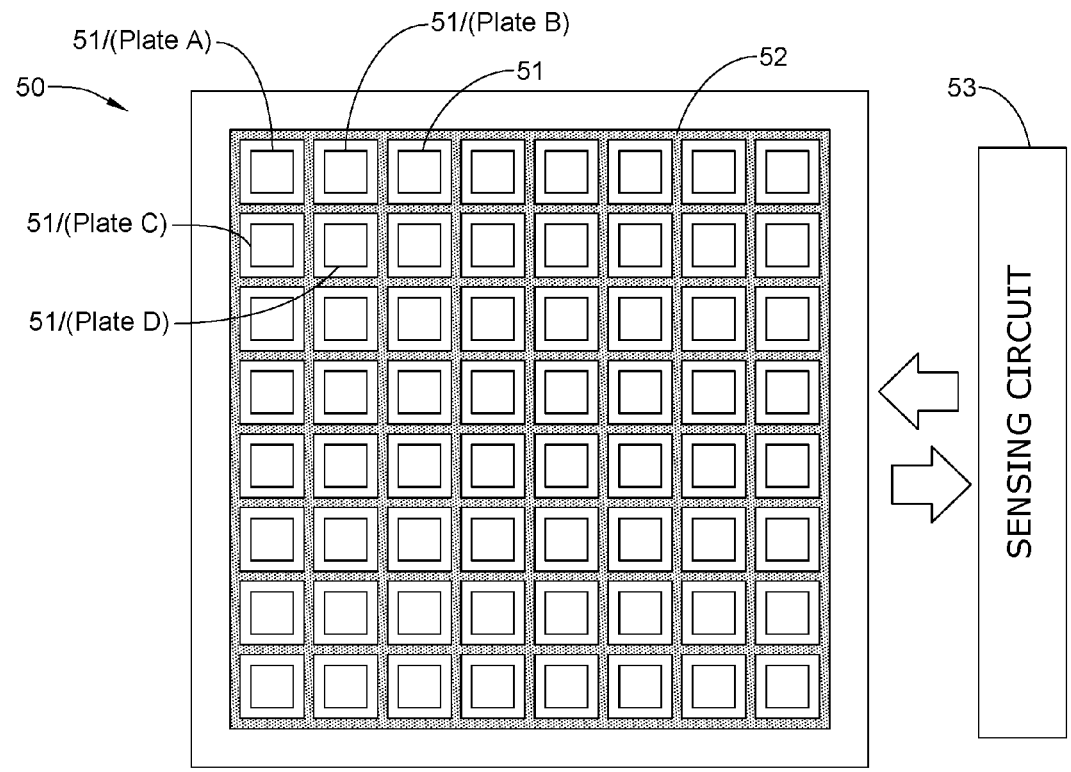
FIG. 12 is a schematic view of a projected capacitive fingerprint sensor.
Figure 13:
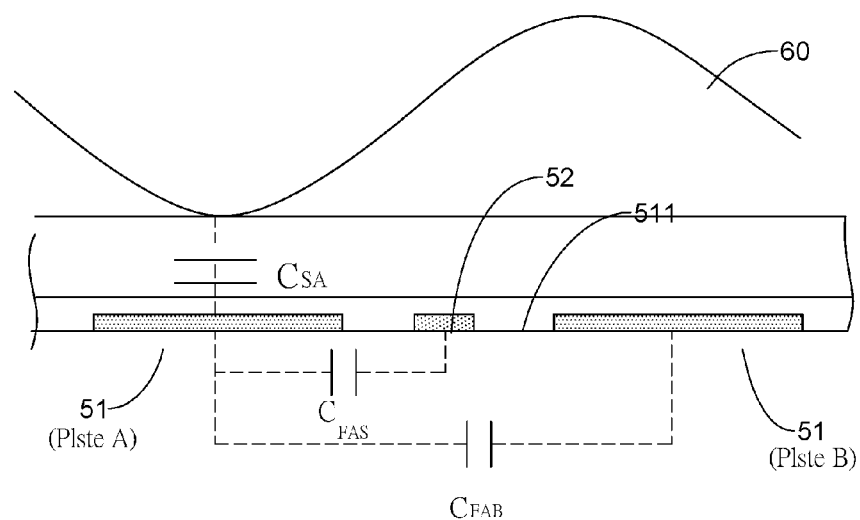
FIG. 13 is a schematic view of a finger and a projected capacitive fingerprint sensor.

The present invention provides a sensing method and circuit of a fingerprint sensor. The sensing circuit of the present invention may be applied to a fingerprint sensor as shown in FIG. 12. Multiple electrode plates 51 on the fingerprint sensor are arranged in a matrix. A grid space is defined among the electrode plates 51. In FIG. 1A, a protection electrode 52 is formed inside the grid space and is coplanar with the electrode plates 51. In another embodiment, as shown in FIG. 1B, the protection electrode 52 is located above the electrode plates 51 and a dielectric layer 502 is formed between the protection electrode 52 and the electrode plates 51. In another embodiment, the protection electrodes 52 are respectively formed on a plane coplanar with the electrode plates 51, and a plane above the electrode plates 51. Two layers of the protection electrodes 52 are electrically connected to each other.

Figure 3:
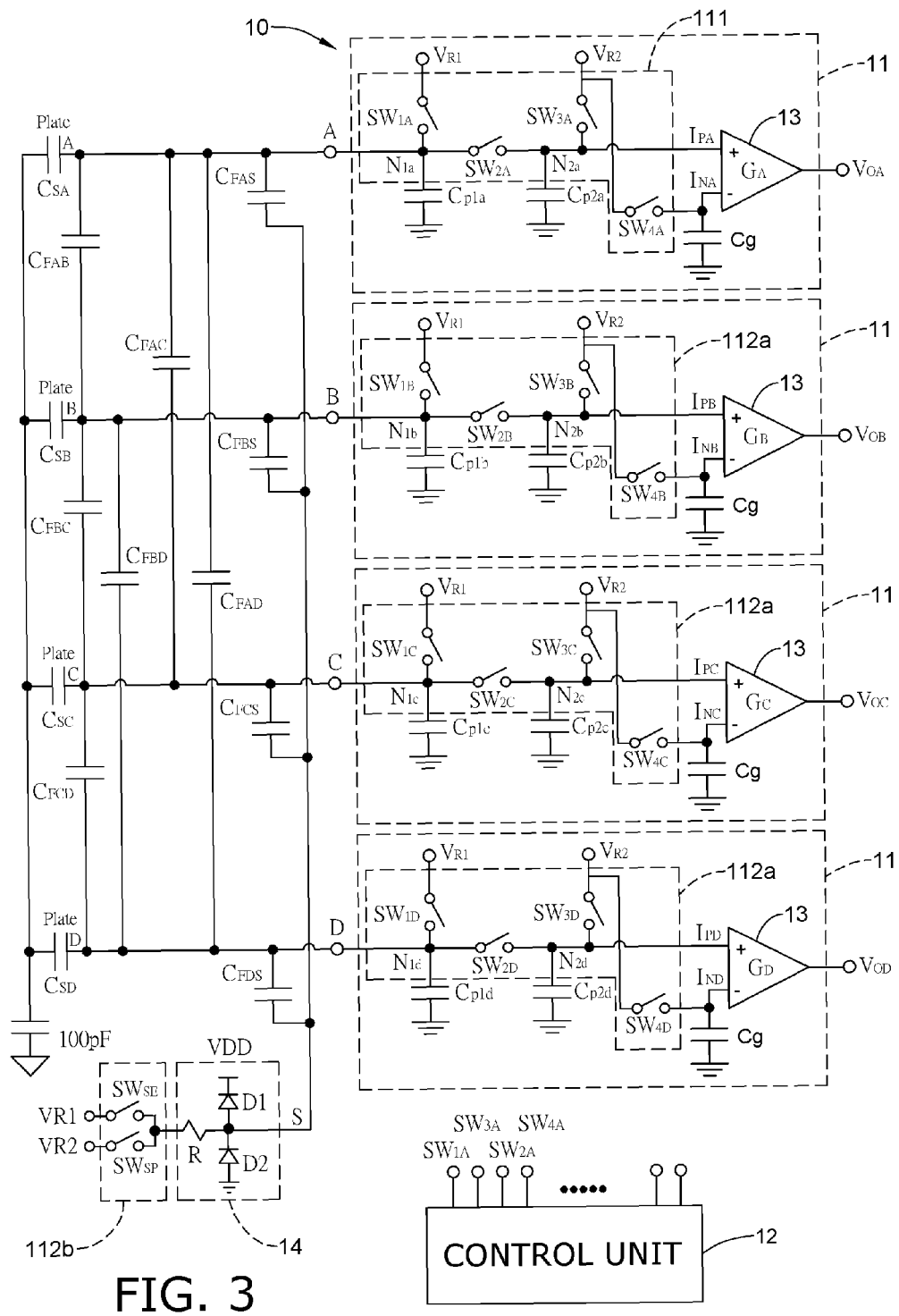
FIG. 3 is a circuit diagram of a first embodiment of a sensing circuit of the fingerprint sensor in accordance with the present invention.

In following descriptions and drawings, four electrode plates (Plate A~Plate D) located on a left-upper area of a projected capacitive fingerprint sensor of FIG. 12 are used to describe the sensing circuit of the present invention and operations thereof, and the measurement of electrode plate (Plate A) is used as an example to describe the process. In FIG. 3, four symbols $C_{SA}$~$C_{SD}$ respectively represent four capacitors, which are respectively formed between a finger and the electrode plates (Plate A~Plate D). Three symbols $C_{FAB}$, $C_{FAC}$, $C_{FAD}$ respectively represent three capacitors, which are respectively formed between the electrode plate (Plate A) and each of adjacent electrode plates (Plate B~Plate D). A symbol $C_{FAS}$ represents a capacitor, which is formed between the electrode plate (Plate A) and the protection electrode 52 (such as an electrostatic discharge protection electrode; ESD protection electrode). A symbol $C_{p1a}$ represents other parasitic capacitors related to a node $N_{1a}$ and a symbol $C_{p2a}$ represents other parasitic capacitors related to a node $N_{2a}$. Other similar symbols have similar representations and the details are not described below for the sake of brevity.

FIG. 1A and FIG. 3 illustrate a first embodiment of the sensing circuit 10 of the present invention. The sensing circuit 10 has multiple detecting units 11 and a control unit 12. The multiple detecting units 11 are respectively connected to the electrode plates (Plate A~Plate D).

The following description uses the electrode plate (Plate A) as an electrode plate to be measured as an example. The detecting unit 11 connected to the electrode plate to be measured (Plate A) has a first switching unit 111 and a read-out circuit 13. Each of other detecting units 11 connected to the electrode plates (Plate B~Plate D) has a second switching unit 112a and a read-out circuit 13. The protection electrode 52 provides an electrostatic protection for the electrode plate and connects to a second switching unit 112b.

With reference to FIG. 3, the first switching unit 111 has a first node $N_{1a}$ connected to the electrode plate to be measured (Plate A) and a second node $N_{2a}$ connected to the read-out circuit 13. The first switching unit 111 couples a first voltage $V_{R1}$ to the first node $N_{1a}$ and couples the second voltage $V_{R2}$ to the second node $N_{2a}$. The first voltage $V_{R1}$ minus the second voltage $V_{R2}$ leaves a non-zero value. In the first switching unit 111, a first switch $SW_{1A}$ is connected between the first voltage $V_{R1}$ and the first node $N_{1a}$, a second switch $SW_{3A}$ is connected between the second voltage $V_{R2}$ and the second node $N_{2a}$ and a third switch $SW_{2A}$ is connected between the first node $N_{1a}$ and the second node $N_{2a}$.

In FIG. 3, three second switching units 112a are respectively connected to the electrode plates (Plate B~Plate D) through three third nodes $N_{1b}$~$N_{1d}$ and respectively connected to three read-out circuit 13 through three fourth node $N_{2b}$~$N_{2d}$. Each of the second switching units 112a is coupled to the first voltage $V_{R1}$ and the second voltage $V_{R2}$. The read-out circuit 13 is used to read out a measurement of the electrode plate to be measured (Plate A). The read-out circuit 13 may be a differential circuit or a buffer. In the present embodiment, the read-out circuit 13 is a differential circuit having a non-inverting input (+), an inverting input (−) and a voltage output $V_{OA}$. A gain of the differential circuit is $G_A$.

The first switching unit 111 has the first switch $SW_{1A}$, the second switch $SW_{3A}$, the third switch $SW_{2A}$ and the fourth switch $SW_{4A}$. The first switch $SW_{1A}$ is used to couple the first voltage $V_{R1}$ to the first node $N_{1a}$. The second switch $SW_{3A}$ is used to couple the second voltage $V_{R2}$ to the second node $N_{2a}$ and the second node $N_{2a}$ is connected to the non-inverting input (+) of the differential circuit. The third switch $SW_{2A}$ is located between the first node $N_{1a}$ and the second node $N_{2a}$ and used to determine whether the first node $N_{1a}$ connects to the second node $N_{2a}$ or not. The fourth switch $SW_{4A}$ is coupled between the second voltage $V_{R2}$ and the inverting input (−) of the differential circuit.

The second switching unit 112a connected to the electrode plate (Plate B) has a first switch $SW_{1B}$, the second switch $SW_{3B}$, the third switch $SW_{2B}$ and the fourth switch $SW_{4B}$. The first switch $SW_{1B}$ is used to couple the first voltage $V_{R1}$ to the third node $N_{1b}$. The second switch $SW_{3B}$ is used to couple the second voltage $V_{R2}$ to the fourth node $N_{2b}$ and the fourth node $N_{2b}$ is connected to the non-inverting input (+) of the differential circuit. The third switch $SW_{2B}$ is located between the third node $N_{1b}$ and the fourth node $N_{2b}$ and used to determine whether the third node $N_{1b}$ connects to the fourth node $N_{2b}$ or not. The fourth switch $SW_{4B}$ is coupled between the second voltage $V_{R2}$ and the inverting input (−) of the differential circuit.

The three second switching units 112a has the same switches and the same connections arrangement, wherein multiple similar symbols in FIG. 3 have similar representations and thus the details of the other two second switching units 112a connected to the electrode plates (Plate C and Plate D) are not described here for the sake of brevity. A grounded capacitor Cg is connected to the non-inverting input (+) of the differential circuit.

An electrostatic discharge (hereafter ESD) protection circuit 14 is coupled between the protection electrode 52 and the second switching units 112b to provide a discharging path for static electricity. The ESD protection circuit 14 has a first diode D1, a second diode D2 and a resistor element R. An anode of the first diode D1 is connected to the protection electrode 52 and a cathode thereof is connected to a high voltage VDD. A cathode of the second diode D2 is connected to the anode of the first diode D1 and the protection electrode 52. An anode of the second diode D2 is connected to ground. One terminal of the resistor element R is connected to a connection node between the first and second diodes D1, D2 and the other terminal of the resistor element R is connected the second switching unit 112b. The second switching unit 112b has a first switch $SW_{SE}$ and the second switch $SW_{SP}$. The first switch $SW_{SE}$ is coupled between the first voltage $V_{R1}$ and the resistor element R and the second switch $SW_{SP}$ is coupled between the voltage $V_{R2}$ and the resistor element R. Using the resistor element R with a larger resistance can avoid static electricity flowing to the second switching unit 112b. When static electricity with a voltage larger than an amount of the high voltage VDD and a turn-on voltage of the first diode D1 occurred on the protection electrode 52, the first diode D1 is turned on and the static electricity is discharged quickly. Similarly, When the static electricity with a negative voltage less than a difference calculated by subtracting a turn-on voltage of the second diode D2 from the ground voltage is occurred on the protection electrode 52, the second diode D2 is turned on and the static electricity with the negative voltage is discharged quickly.

In FIG. 3, the first to fourth switches $SW_{1A}$~$SW_{1D}$, $SW_{3A}$~$SW_{3D}$, $SW_{2A}$~$SW_{2D}$, $SW_{4A}$~$SW_{4D}$ and the first and second switches $SW_{SE}$, $SW_{SP}$ of the second switching unit 112b are controlled to turn on or turn off by the control unit 12.

A following description describes the operations of detecting electrode plate (Plate A).

Figure 4A:
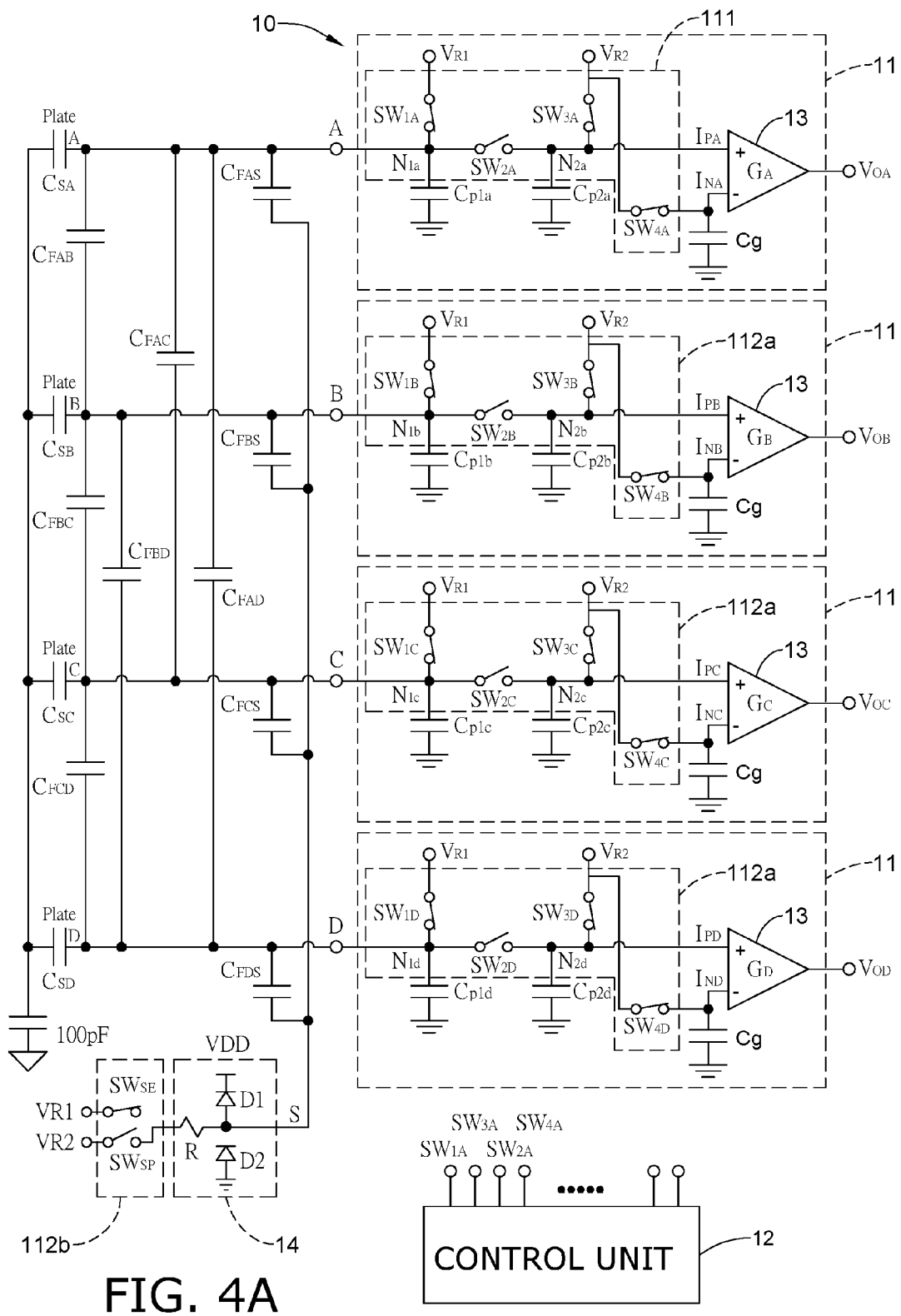
FIGS. 4A and 4B are two different circuit diagrams of the sensing circuit of FIG. 3 respective in first and second phases.

In a first phase (excitation phase or pre-charge phase), a status of each switch is shown in FIG. 4A. The first, second and fourth switches $SW_{1A}$, $SW_{3A}$, $SW_{4A}$ are turned on, such that the first node $N_{1a}$ connects to the first voltage $V_{R1}$ and the second node $N_{2a}$ connects to the second voltage $V_{R2}$. The third switch $SW_{2A}$ is turned off to disconnect the first node $N_{1a}$ to the second node $N_{2a}$. In each second switching unit 112a, the first, second and fourth switches $SW_{1B}$~$SW_{1D}$, $SW_{3B}$~$SW_{3D}$, $SW_{4B}$~$SW_{4D}$ are turned on, such that the third node $N_{1b}$~$N_{1d}$ connects to the first voltage $V_{R1}$ and the fourth node $N_{2b}$~$N_{2d}$ connects to the second voltage $V_{R2}$. Thus, the first voltage $V_{R1}$ is supplied to the electrode plate (Plate B~Plate D). The third switch $SW_{2B}$~$SW_{2D}$ of each second switching unit 112a are turned off to disconnect the third node $N_{1b}$~$N_{1d}$ to the fourth node $N_{2b}$~$N_{2d}$. In the second switching unit 112b, the first switch $SW_{SE}$ is turned on and the second switch $SW_{SP}$ is turned off to connect the protection electrode 52 to the first voltage $V_{R1}$ through the resistor element R. Briefly, in the first phase, the electrode plate to be measured (Plate A), the other electrode plate (Plate B~Plate D) and the protection electrode 52 are connected to the first voltage $V_{R1}$.

Figure 4B:
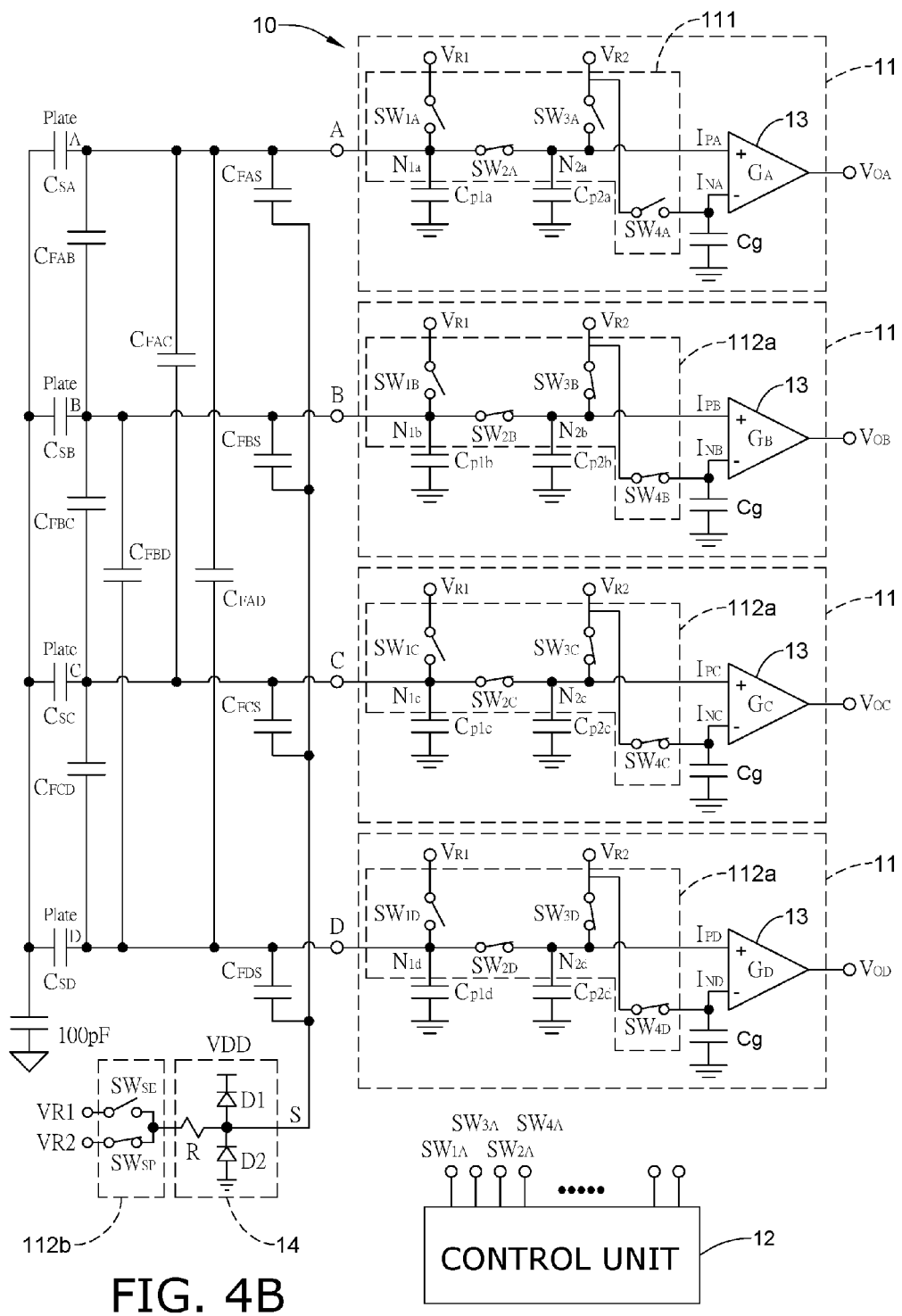

In the second phase (reading phase or evaluation phase), the status of each switch of FIG. 3 is shown in FIG. 4B. In the first switching unit 111, the first, second and fourth switches $SW_{1A}$, $SW_{3A}$, $SW_{4A}$ are turned off, such that the first node $N_{1a}$ disconnects to the first voltage $V_{R1}$ and t the second node $N_{2a}$ disconnects to the second voltage $V_{R2}$. The third switch $SW_{2A}$ is turned on to connect the first node $N_{1a}$ to the second node $N_{2a}$. In each second switching unit 112a, the first switches $SW_{1B}$~$SW_{1D}$ are turned off to disconnect the third nodes $N_{1b}$~$N_{1d}$ to the first voltage $V_{R1}$. The second and fourth switches $SW_{3B}$~$SW_{3D}$, $SW_{4B}$~$SW_{4D}$ are still turned on so the fourth nodes $N_{2b}$~$N_{2d}$ are connected to the second voltage $V_{R2}$. The third switches $SW_{2B}$~$SW_{2D}$ are turned on to connect the third nodes $N_{1b}$~$N_{1d}$ to the fourth nodes $N_{2b}$~$N_{2d}$. Thus, an electric potential of each electrode plate (Plate B~Plate D) is switched to the second voltage $V_{R2}$. In the second switching unit 112b, the first switch $SW_{SE}$ is turned off and the second switch $SW_{SP}$ is turned on to connect the protection electrode 52 to the second voltage $V_{R2}$. In another embodiment, the fourth switches $SW_{4B}$~$SW_{4D}$ may be turned off.

An output voltage of the differential circuit connected to the first switching unit 111 is $V_{OA}=G_A \times (V_{IPA}-V_{INA})+V_{OCM}$ and is used to represent the measurement result of the electrode plate to be measured (Plate A). After the first and second phases, the output voltage $V_{OA}$ of the read-out circuit 13 connected to the electrode plate to be measured (Plate A) can be represented as following equation: $V_{OA}=G_A\times\{[C_{SA}\times(V_{R1}-V_{R2})]/C_T+[C_{FPPA}\times(V_{R1}-V_{R2}-V_{R1}+V_{R2})]/C_T+[C_{FAS}\times(V_{R1}-V_{R2}-V_{R1}+V_{R2})]/C_T+[C_{p1a}\times(V_{R1}-V_{R2})]/C_T\}+V_{OCM}$; wherein, $G_A$ is the gain of the differential circuit, $C_{FPPA}$ is a sum of $C_{FAB}$, $C_{FAC}$ and $C_{FAD}$. The foregoing equation is further calculated to $V_{OA}=G_A\times\{[C_{SA}\times(V_{R1}-V_{R2})]/C_T+[C_{p1a}\times(V_{R1}-V_{R2})]/C_T\}+V_{OCM}$; wherein $C_T=C_{SA}+C_{FPPA}+C_{FAS}+C_{p1a}+C_{p2a}$, and $V_{OCM}$ is a common mode voltage of the differential circuit. Based on the final equation, a numerator does not include fringe capacitors $C_{FPPA}$ and $C_{FAS}$. Accordingly, the present embodiment indeed improves the influence to the output of the read-out circuit 13, wherein the influence is caused by the capacitors formed between the electrode plate to be measured (Plate A) and the adjacent electrode plates (Plate B~Plate D) and the capacitor formed between the electrode plate to be measured (Plate A) and the protection electrode 52.

Figure 4C:
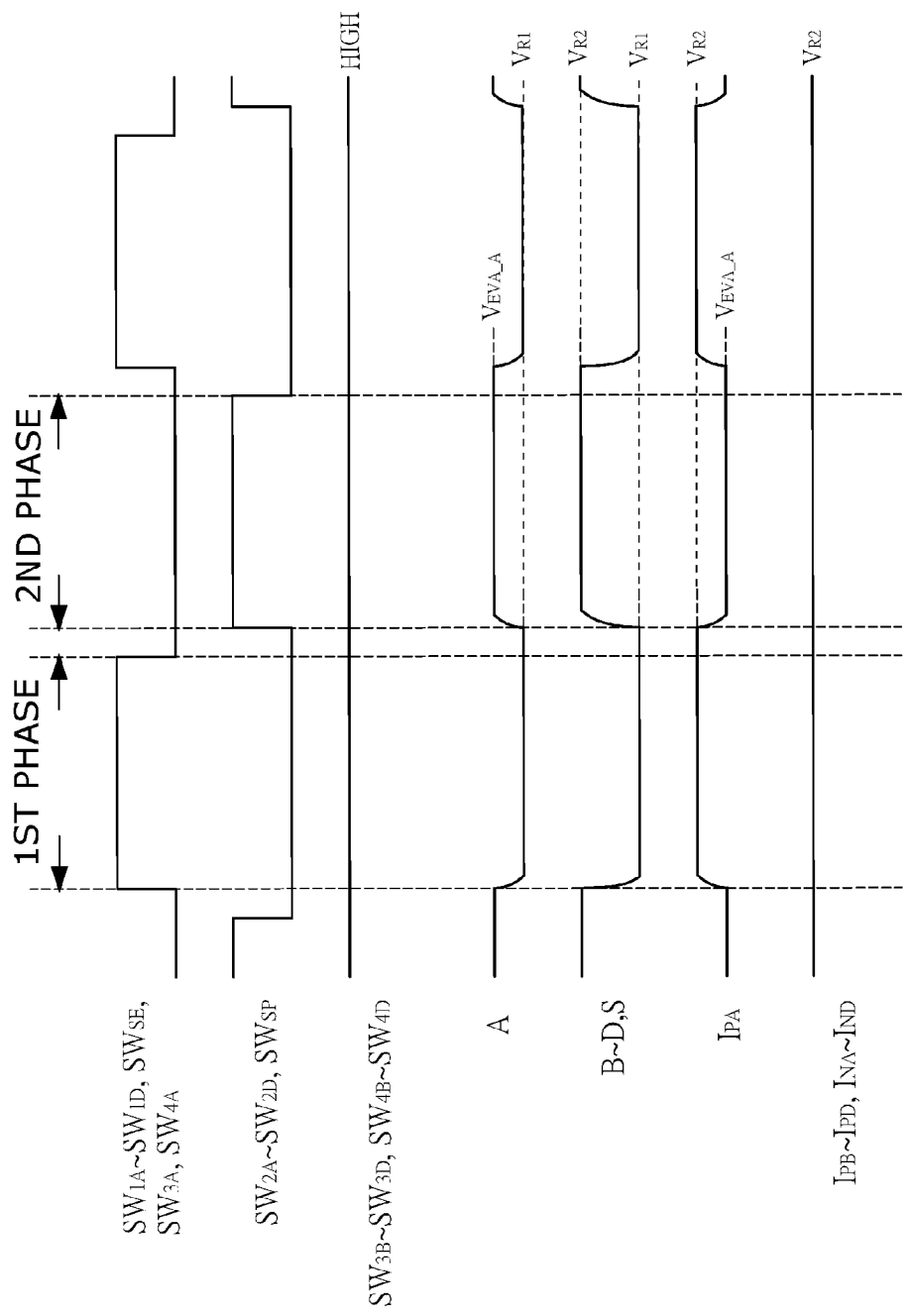
FIG. 4C is a diagram combined a time sequence diagram of each switch and a voltage-variation waveform diagram of each node in FIGS. 4A and 4B.
Figure 5:
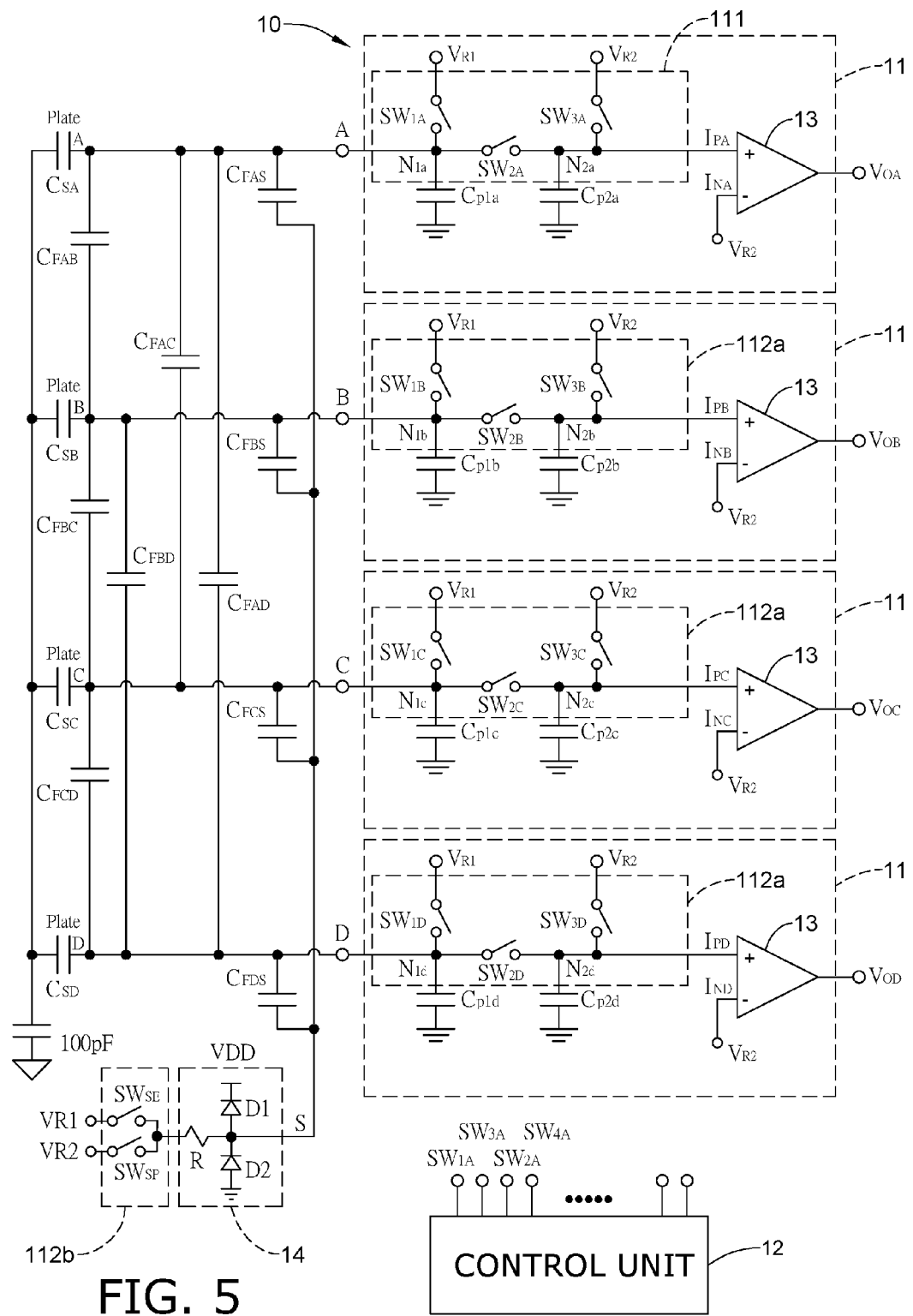
FIG. 5 is a circuit diagram of a second embodiment of a sensing circuit of the fingerprint sensor in accordance with the present invention.

In the first phase shown in FIG. 4A and the second phase shown in FIG. 4B, a time sequence of each switch and a voltage variation of each node in one embodiment are shown in FIG. 4C. In a time sequence diagram of each switch, a high voltage level represents that the switch is turned on and a low voltage level represents that the switch is turned off. In this embodiment, the second voltage $V_{R2}$ is larger than the first Voltage $V_{R1}$. From the first phase to the second phase, the first switches $SW_{1A}$~$SW_{1D}$, $SW_{SE}$, the second switch $SW_{3A}$ and the fourth switch $SW_{4A}$ are turned off before the third switches $SW_{2A}$~$SW_{2D}$ and the second switch $SW_{SP}$ turn on. A voltage level $V_{EVA\_A}$ represents an electric potential of a node $I_{PA}$ when detecting the electrode plate to be measured (Plate A) in the second phase. A second embodiment of FIG. 5 is similar to a first embodiment, and a difference therebetween is the inverting input (−) is directly connected to the second voltage $V_{R2}$.

Figure 6:
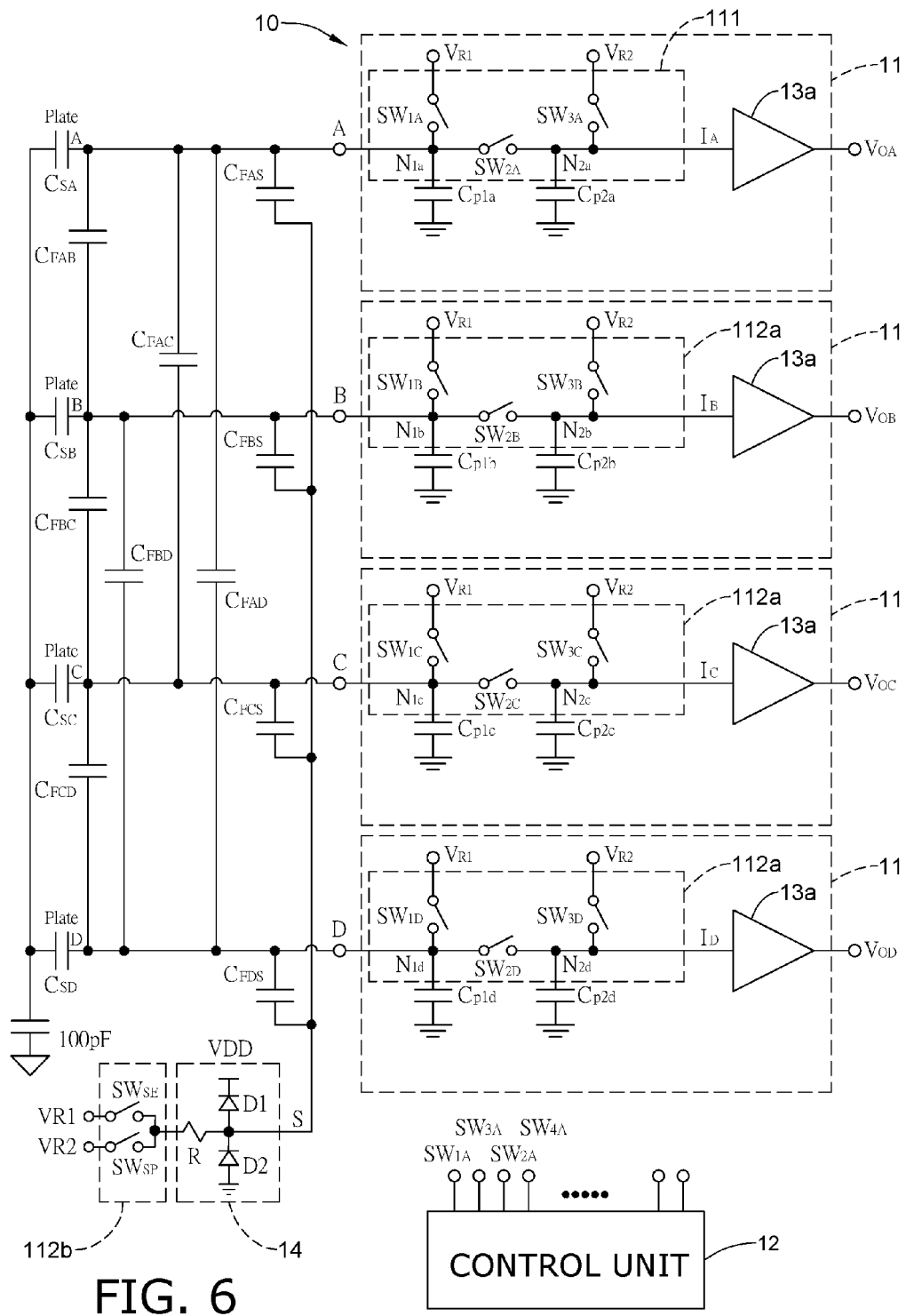
FIG. 6 is a circuit diagram of a third embodiment of a sensing circuit of the fingerprint sensor in accordance with the present invention.

FIG. 6 shows a third embodiment and a difference between the first and third embodiments is that a read-out circuit 13a employs a buffer. In FIG. 6, the second node $N_{2a}$ of the first switching unit 111 is connected to a single input $I_A$ of the buffer. The fourth node $N_{2b} \sim N_{2d}$ of the second switching units 112a are respectively connected to three single inputs $I_B \sim I_D$ of other three buffers. An output voltage of the buffer connected to the first switching unit 111 is $V_{OA} = G_A \times V_{IA} + V_{shift}$. After the foregoing operations of the first and second phases, the output voltage $V_{OA}$ of the buffer connected to the electrode plate to be measured (Plate A) can be represented as an equation: $V_{OA} = G_A \times \{[C_{SA} \times (V_{R1} - V_{R2})]/C_T + [C_{FPPA} \times (V_{R1} - V_{R2} - V_{R1} + V_{R2})]/C_T + [C_{FAS} \times (V_{R1} - V_{R2} - V_{R1} + V_{R2})]/C_T + [C_{p1a} \times (V_{R1} - V_{R2})]/C_T + V_{R2}\} + V_{shift}$. The equation is further calculated to $V_{OA} = G_A \times \{[C_{SA} \times (V_{R1} - V_{R2})]/C_T + [C_{p1a} \times (V_{R1} - V_{R2})]/C_T + V_{R2}\} + V_{shift}$, wherein $C_T = C_{SA} + C_{FPPA} + C_{FAS} + C_{p1a} + C_{p2a}$ and $V_{shift}$ is a voltage offset of the buffer.

Based on the foregoing final equation, the numerator does not include the fringe capacitors $C_{FPPA}$ and $C_{FAS}$. Accordingly, the present invention indeed improves the influence, which is caused by the fringe capacitors $C_{FPPA}$ and $C_{FAS}$, to the output of the read-out circuit by the controls of the first and second phases.

Figure 7A:
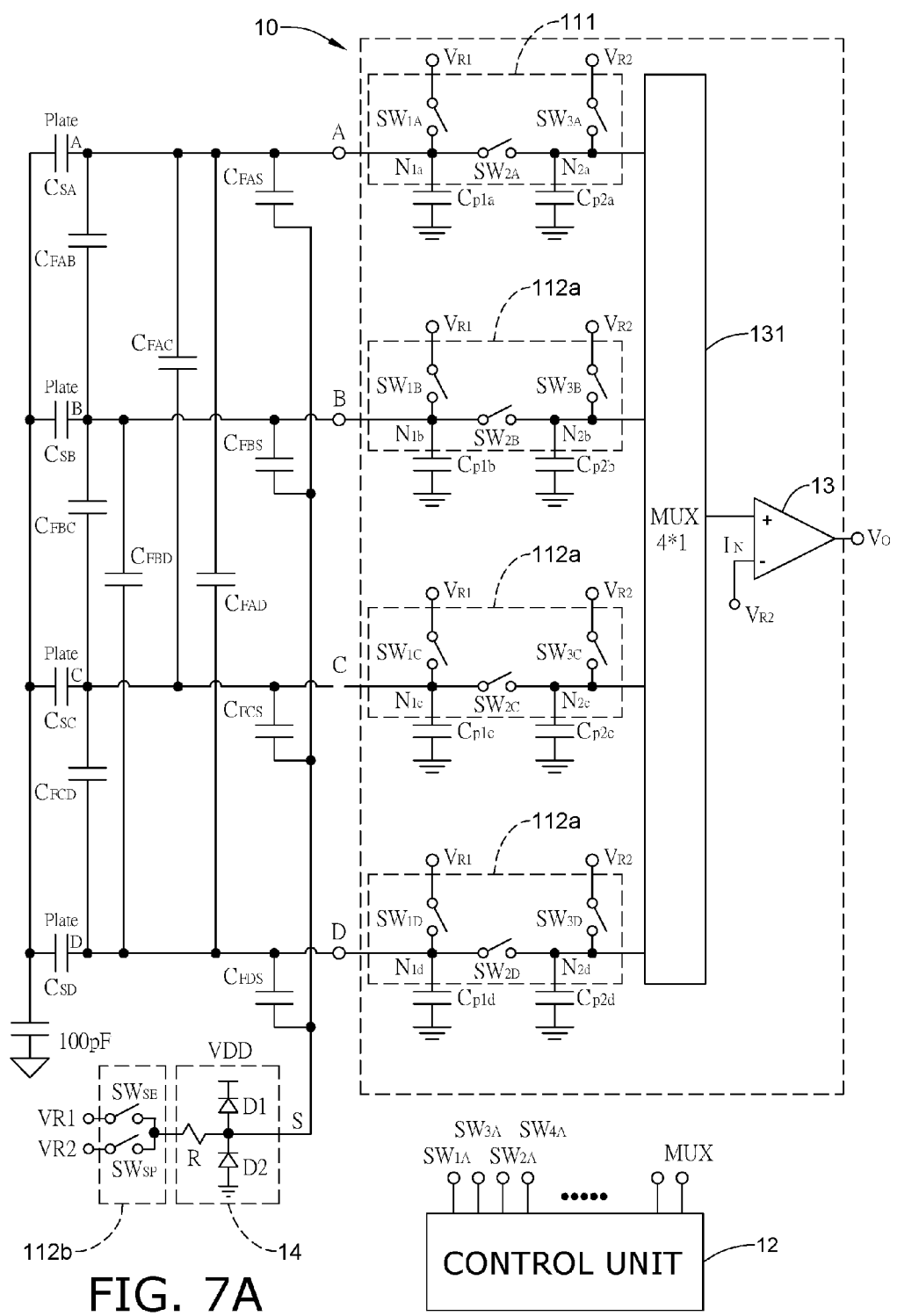
FIG. 7A is a circuit diagram of a fourth embodiment of a sensing circuit of the fingerprint sensor in accordance with the present invention.

In a fourth embodiment of FIG. 7A, the electrode plates (Plates A~Plate D) are connected to a differential circuit through a multiplexer 131. When detecting the electrode plate (Plate A), the control unit 12 controls the multiplex 131 to connect the non-inverting input (+) of the differential circuit to the second node $N_{2a}$. In FIG. 7A, other elements and operations thereof are the same with those in FIG. 3 so that the details are not described here.

Figure 7B:
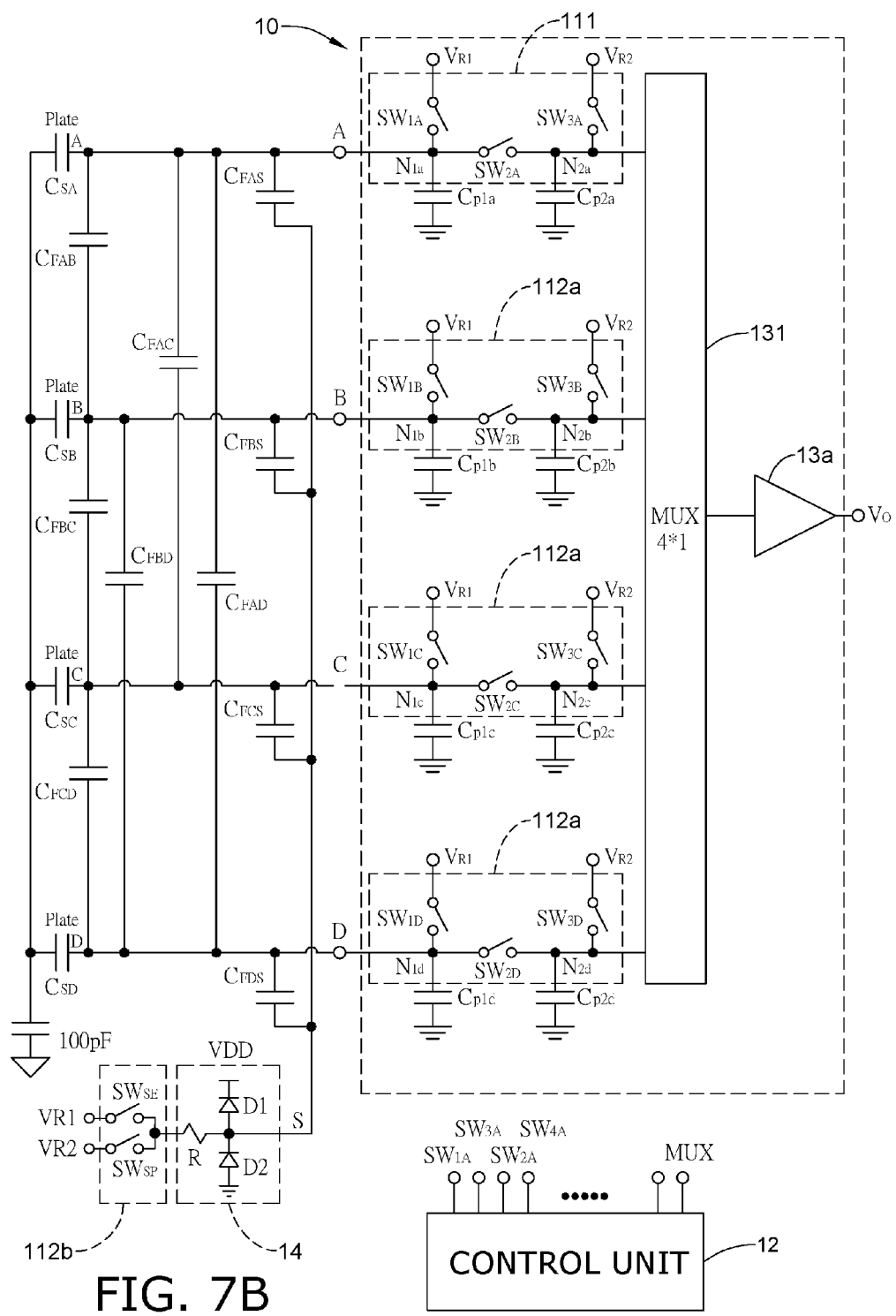
FIG. 7B is a circuit diagram of a fifth embodiment of a sensing circuit of the fingerprint sensor in accordance with the present invention.

In a fifth embodiment of FIG. 7B, the electrode plates (Plates A~Plate D) are connected to a buffer through a multiplexer 131. When detecting the electrode plate (Plate A), the control unit 12 controls the multiplex 131 to connect the input of the buffer to the second node $N_{2a}$. In FIG. 7B, other elements and operations thereof are the same with those in FIG. 6 so that the details are not described here.

In the fourth and fifth embodiments of FIGS. 7A and 7B, the electrode plates (Plate A~Plate D) commonly use one read-out circuit so that the number of the read-out circuits can be reduced.

Figure 8:
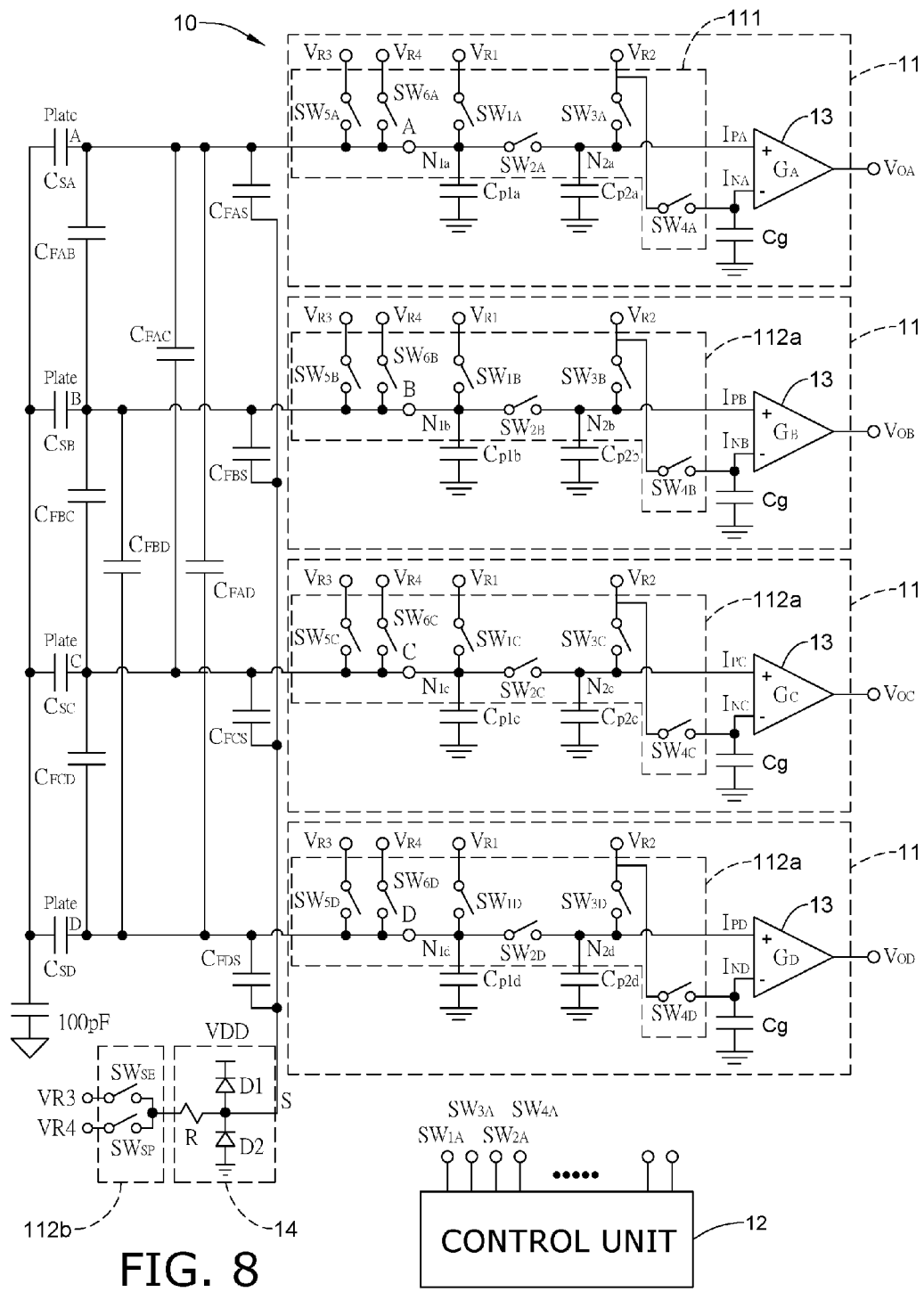
FIG. 8 is a circuit diagram of a sixth embodiment of a sensing circuit of the fingerprint sensor in accordance with the present invention.

FIG. 8 illustrates a sixth embodiment. In FIG. 8, the first switching unit 111 connected to the electrode plate (Plate A) and each of the second switching units 112a connected to the electrode plates (Plate B~Plate D) further has a fifth switch $SW_{5A}$, $SW_{5B}$, $SW_{5C}$, or $SW_{5D}$ connected to a third voltage $V_{R3}$ and a sixth switch $SW_{6A}$, $SW_{6B}$, $SW_{6C}$, or $SW_{6D}$ connected to a fourth voltage $V_{R4}$. The fifth and sixth switches $SW_{5A} \sim SW_{5D}$, $SW_{6A} \sim SW_{6D}$ are used to respectively couple the third voltage $V_{R3}$ and the fourth voltage $V_{R4}$ to the electrode plates (Plate A~Plate D) to switch the electric potentials of the electrode plates (Plate A~Plate D). In the second switching unit 112b, the first and second switches $SW_{SE}$, $SW_{SP}$ are respectively coupled to the third and fourth voltages $V_{R3}$, $V_{R4}$. A difference calculated by subtracting the fourth voltage $V_{R4}$ from the third voltage $V_{R3}$ is equal to a difference calculated by subtracting the second voltage $V_{R2}$ from the first voltage $V_{R1}$ ($V_{R3} - V_{R4} = V_{R1} - V_{R2}$). The control unit 12 controls all of the switches to turn on or turn off. Other elements and connections thereof are the same with those in FIG. 3 so that the details are not described here. An arrangement of FIG. 8 can also improves the influence, which is caused by fringe capacitors $C_{FPPA}$, $C_{FAS}$, to the output voltage of the read-out circuit 13. The following description also uses detecting the electrode plate (Plate A) as an example to describe the operations of the circuit shown in FIG. 8.

Figure 9A:
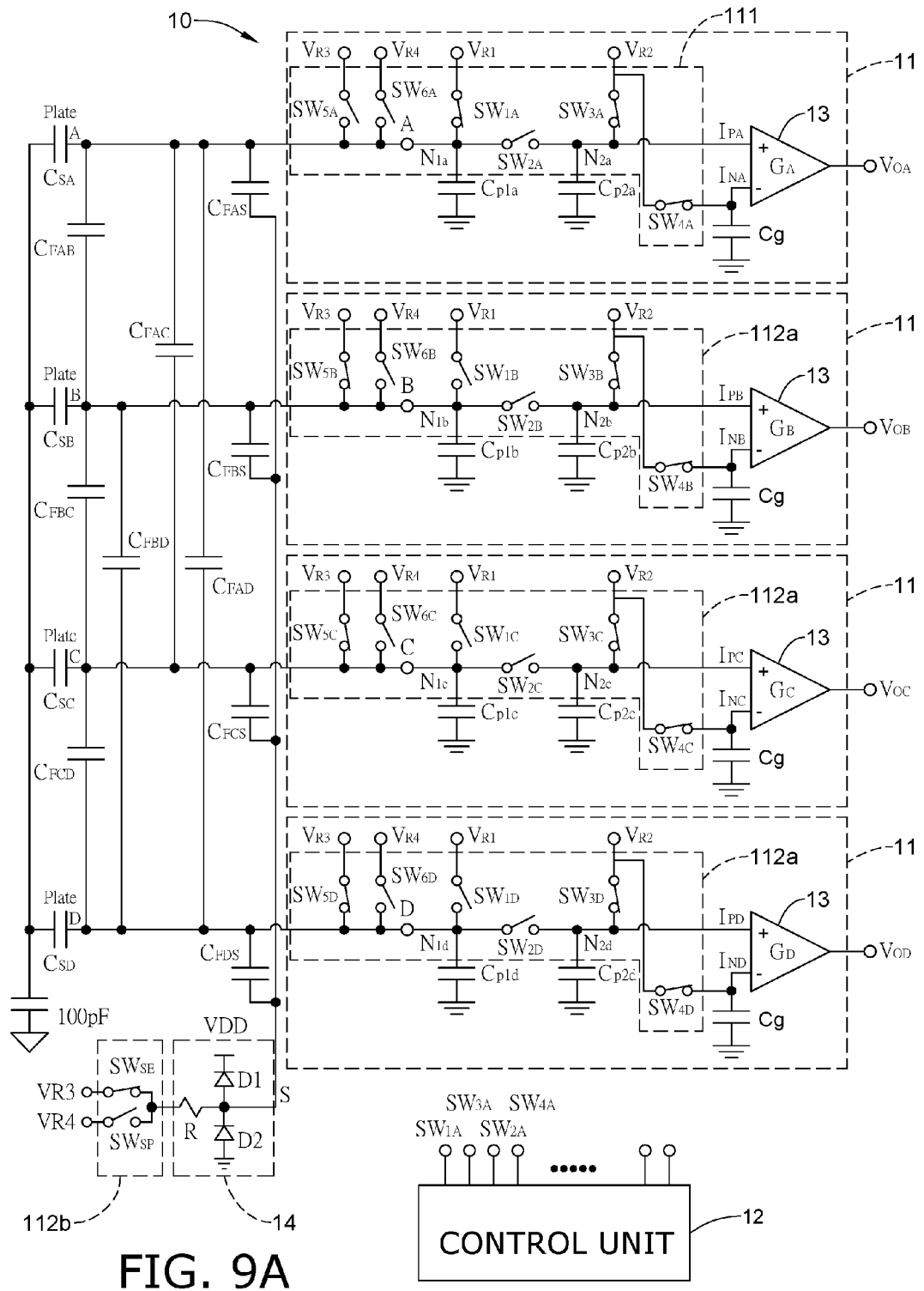
FIGS. 9A to 9C are three different circuit diagrams of the sensing circuit of FIG. 8 respective in first to third phases.

In the first phase (excitation phase or pre-charge phase), a status of each switch of FIG. 8 is shown in FIG. 9A. The first, second and fourth switches $SW_{1A}$, $SW_{3A}$, $SW_{4A}$ of the first switching unit 111 are turned on, such that the first node $N_{1a}$ connects to the first voltage $V_{R1}$, the second node $N_{2a}$ connects to the first voltage $V_{R2}$, and the inverting input $I_{NA}$ of the differential circuit connects to the second voltage $V_{R2}$. The third switch $SW_{2A}$ is turned off to disconnect the first node $N_{1a}$ to the second node $N_{2a}$. The fifth switch $SW_{5A}$ and the sixth switch $SW_{6A}$ are turned off. In each second switching unit 112a, the fifth switches $SW_{5B} \sim SW_{5D}$ are turned on and the first and sixth switches $SW_{1B} \sim SW_{1D}$, $SW_{6B} \sim SW_{6D}$ are turned off, such that the electrode plates (Plate B~Plate D) connect to the third voltage $V_{R3}$. The third switches $SW_{2B} \sim SW_{2D}$ are turned off to disconnect the third nodes $N_{1b} \sim N_{1d}$ to the fourth nodes $N_{2b} \sim N_{2d}$. The second switches $SW_{3B} \sim SW_{3D}$ and the fourth switches $SW_{4B} \sim SW_{4D}$ are turned on. The first switch $SW_{SE}$ of the second switching unit 112b is turned on and the second switch $SW_{SP}$ is turned off such that the protection electrode 52 connects to the third voltage $V_{R3}$ through the resistor element R. Briefly, in the first phase, the electrode plate to be measured (Plate A) is connected to the first voltage $V_{R1}$ and the other electrode plates (Plate B~Plate D) and the protection electrode 52 are connected to the third voltage $V_{R3}$. In another embodiment, the second switches $SW_{3B} \sim SW_{3D}$ and the fourth switches SW4B~SW4D may be turned off.

Figure 9B:
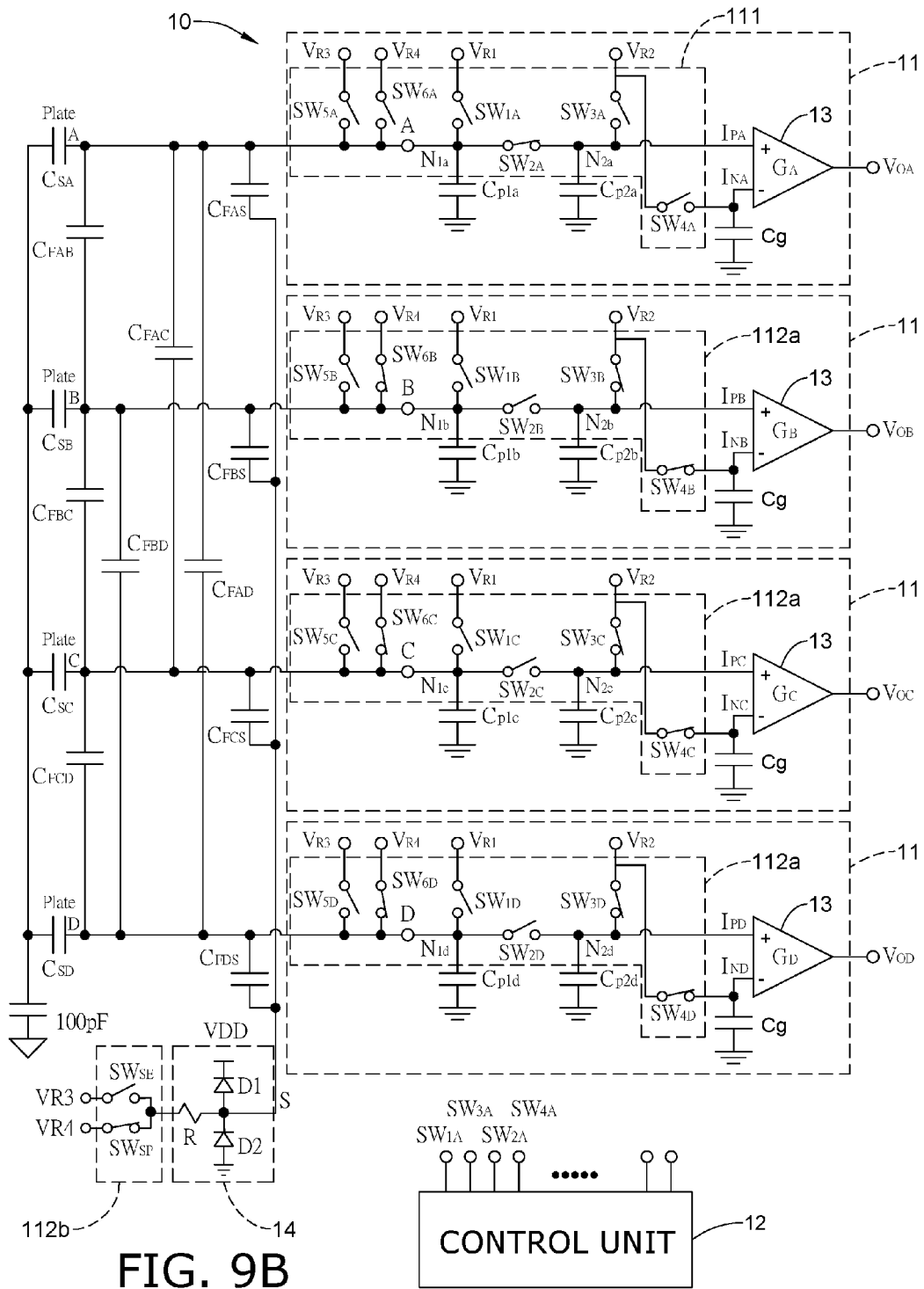

In the second phase (reading phase or evaluation phase), a status of each switch of FIG. 8 is shown in FIG. 9B. The first, second and fourth switches $SW_{1A}$, $SW_{3A}$, $SW_{4A}$ of the first switching unit 111 are turned off to disconnect the first node $N_{1a}$ to the first voltage $V_{R1}$ and to disconnect the second node $N_{2a}$ to the first voltage $V_{R2}$. The third switch $SW_{2A}$ is turned on to connect the first node $N_{1a}$ to the second node $N_{2a}$. The fifth switch $SW_{5A}$ and the sixth switch $SW_{6A}$ are still turned off. In each second switching unit 112a, the fifth switches $SW_{5B} \sim SW_{5D}$ are turned off to disconnect the electrode plates (Plate B~Plate D) to the third voltage $V_{R3}$. The sixth switches $SW_{6B} \sim SW_{6D}$ are turned on to connect the electrode plates (Plate B~Plate D) to the fourth voltage $V_{R4}$. The first and third switches $SW_{1B} \sim SW_{1D}$, $SW_{2B} \sim SW_{2D}$ are turned off. The second switches $SW_{3B} \sim SW_{3D}$ and the fourth switches $SW_{4B} \sim SW_{4D}$ may be turned on or turned off. The first switch $SW_{SE}$ of the second switching unit 112b is turned off and the second switch $SW_{SP}$ is turned on to connect the protection electrode 52 to the fourth voltage $V_{R4}$ through the resistor element R.

Figure 9C:
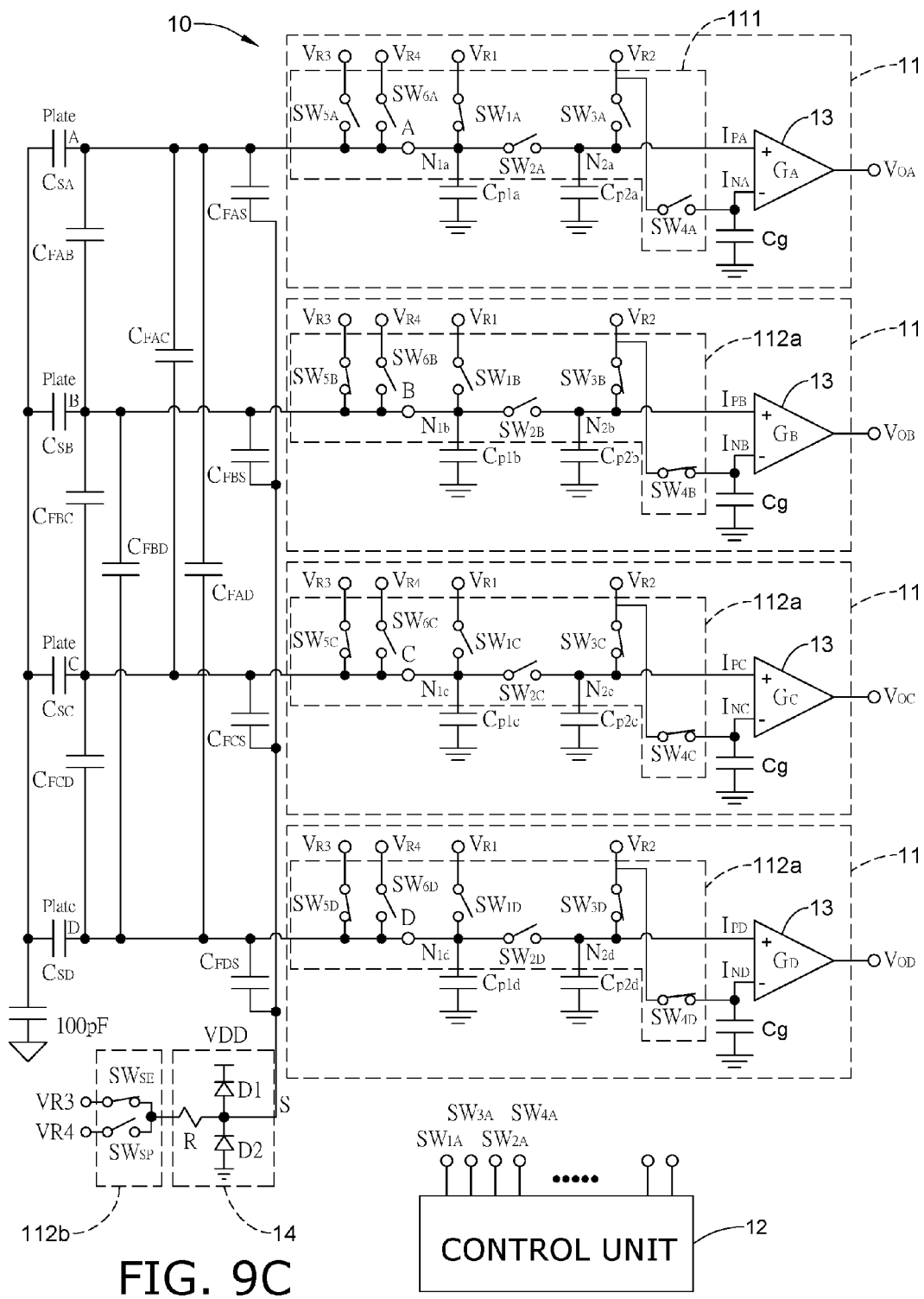

The output voltage of the differential circuit connected to the first switching unit 111 is $V_{OA} = G_A \times (V_{IPA} - V_{INA}) + V_{OCM}$, which represents a measurement result of the electrode plate to be measured (Plate A). After the operations of the first and second phases, the output voltage $V_{OA}$ of the read-out circuit 13 connected to the electrode plate to be measured (Plate A) can be represented as an equation: $V_{OA} = G_A \times \{[C_{SA} \times (V_{R1} - V_{R2})]/C_T + [C_{FPPA} \times (V_{R1} - V_{R2} - V_{R3} + V_4)]/C_T + [C_{FAS} \times (V_{R1} - V_{R2} - V_{R3} + V_{R4})]/C_T + [C_{p1a} \times (V_{R1} - V_{R2})]/C_T\} + V_{OCM}$. When the difference calculated by subtracting the fourth voltage $V_{R4}$ from the third voltage $V_{R3}$ is equal to the difference calculated by subtracting the second voltage $V_{R2}$ from the first voltage $V_{R1}$ ($V_{R3} - V_{R4} = V_{R1} - V_{R2}$), the foregoing equation is calculated to $V_{OA}=G_A\times\{[C_{SA}\times(V_{R1}-V_{R2})]/C_T+[C_{p1a}\times(V_{R1}-V_{R2})]/C_T\}+V_{OCM}$, wherein $C_T=C_{SA}+C_{FPPA}+C_{FAS}+C_{p1a}+C_{p2a}$, and $V_{OCM}$ is a common mode voltage of the differential circuit. Based on the final equation, an effect of the fringe capacitors $C_{FPPA}$ and $C_{FAS}$ is reduced. In another embodiment, the output voltage $V_{OA}$ is not read out in the second phase shown in FIG. 9B and then proceeding to a third phase as shown in FIG. 9C. In FIG. 9C, the first switch $SW_{1A}$ of the first switching unit 111 is turned on to connect the first node $N_{1a}$ to the first voltage $V_{R1}$, again. The second switch $SW_{3A}$ and fourth switch $SW_{4A}$ are turned off. In each second switching unit 112a, the fifth switch $SW_{5B}\sim SW_{5D}$ are turned on and the sixth switches $SW_{6B}\sim SW_{6D}$ are turned off, such that the electrode plates (Plate B~Plate D) connect to the third voltage $V_{R3}$, again. In the second switching unit 112b, the first switch $SW_{SE}$ is turned on and the second switch $SW_{SP}$ is turned off, such that the protect electrode 52 connects to the third voltage $V_{R3}$ through the resistor element R. The statuses of the other switches are the same with those in the first phase of FIG. 9A. Briefly, in the third phase, the electrode plate to be measured (Plate A) is connected to the first voltage and the electrode plates (Plate B~Plate D) and the protection electrode 52 are connected to the third voltage $V_{R3}$.

Next, another operation, which is the same as that of the second phase, is proceeded. At this time, the electrode plate (Plate B~Plate D) is connected to the fourth voltage $V_{R4}$. After such the third phase of FIG. 9C and the second phase of FIG. 9B are repeated for several times, the output voltage $V_{OA}$ is read out in a final second phase. At this time, a voltage $V_{P2}$ of the second node $N_{2a}$ is $$V_{P2}=\left\{[C_{SA}\times(V_{R1}-V_{R2})]/C_T+[C_{FPPA}\times(V_{R1}-V_{R2}-V_{R3}+V_4)]/C_T+[C_{FAS}\times(V_{R1}-V_{R2}-V_{R3}+V_{R4})]/C_T+[C_{p1a}\times(V_{R1}-V_{R2})]/C_T\right\}\times\left(\sum_{i=1}^{n}x^{i-1}\right)+V_{R2}.$$

When the difference calculated by subtracting the fourth voltage $V_{R4}$ from the third voltage $V_{R3}$ is equal to the difference calculated by subtracting the second voltage $V_{R2}$ from the first voltage $V_{R1}$ ($V_{R3}-V_{R4}=V_{R1}-V_{R2}$), the foregoing equation is calculated to $$V_{P2}=\{[C_{SA}\times(V_{R1}-V_{R2})]/C_T+[C_{p1a}\times(V_{R1}-V_{R2})]/C_T\}\times\left(\sum_{i=1}^{n}x^{i-1}\right)+V_{R2},$$

wherein $C_T=C_{SA}+C_{FPPA}+C_{FAS}+C_{p1a}+C_{p2a}$, $x=C_{p2a}/C_T$, $x=C_{p2a}/C_T$ and n is the number of switching times between the second and the third phase.

Figure 10A:
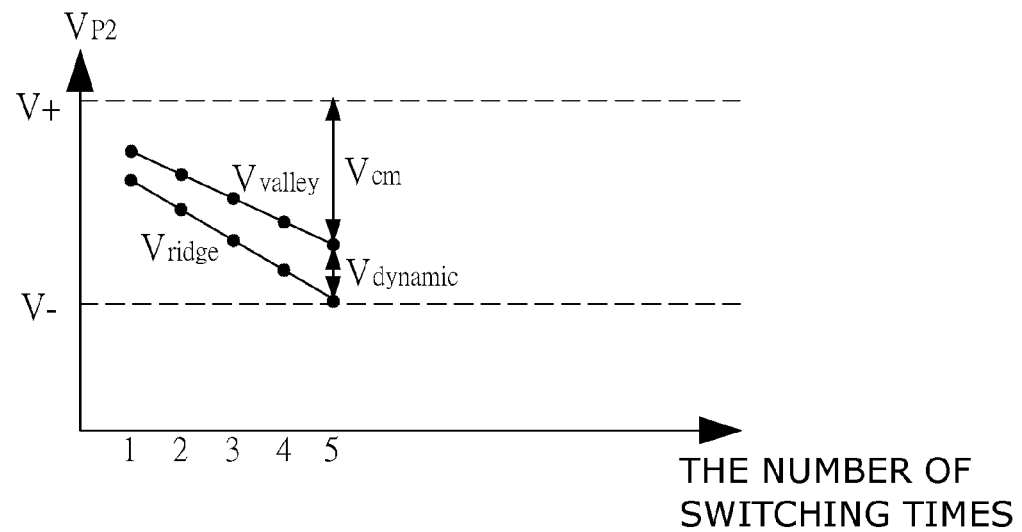
FIG. 10A is a diagram of dynamic voltage range and switching number in accordance with the present invention.

After such the third phase of FIG. 9C and the second phase of FIG. 9B are switched repeatedly for several times, multiple measurement results of the electrode plate (Plate A) are accumulated at the second node $N_{2a}$. When the second voltage $V_{R2}$ is larger than the first voltage $V_{R1}$, the relationship between the switching times and the voltage of the second node $N_{2a}$ is shown in FIG. 10. A symbol $V_{valley}$ represents a voltage caused by a valley part of a fingerprint and a symbol $V_{ridge}$ represents a voltage caused by a ridge part of the fingerprint. As the number of switching times between the second and the third phase is increasing, a difference between $V_{valley}$ and $V_{ridge}$ are increased. It is helpful to determine that the present measurement result represents the valley part or the ridge part of the fingerprint, thus an accuracy of detecting fingerprint is increased. In the other embodiments (for example, using different read-out circuits 13 or different arrangement of the switching units), multiple measurement results may be also accumulated by switching between the second and third phases for several times. In the other embodiments, in the second switching unit 112b of FIGS. 8, 9A to 9C, the first switch $SW_{SE}$ may be connected to the first voltage $V_{R1}$, the second switch $SW_{SP}$ may be connected to the second voltage $V_{R2}$ and a difference calculated by subtracting the fourth voltage $V_{R4}$ from the third voltage $V_{R3}$ is equal to a difference calculated by subtracting the second voltage $V_{R2}$ from the first voltage $V_{R1}$ ($V_{R3}-V_{R4}=V_{R1}-V_{R2}$). That means that using another voltage combination with the same difference to replace the third and fourth voltages $V_{R3}$, $V_{R4}$ connected to the second switching unit 112b is possible.

Figure 9D:
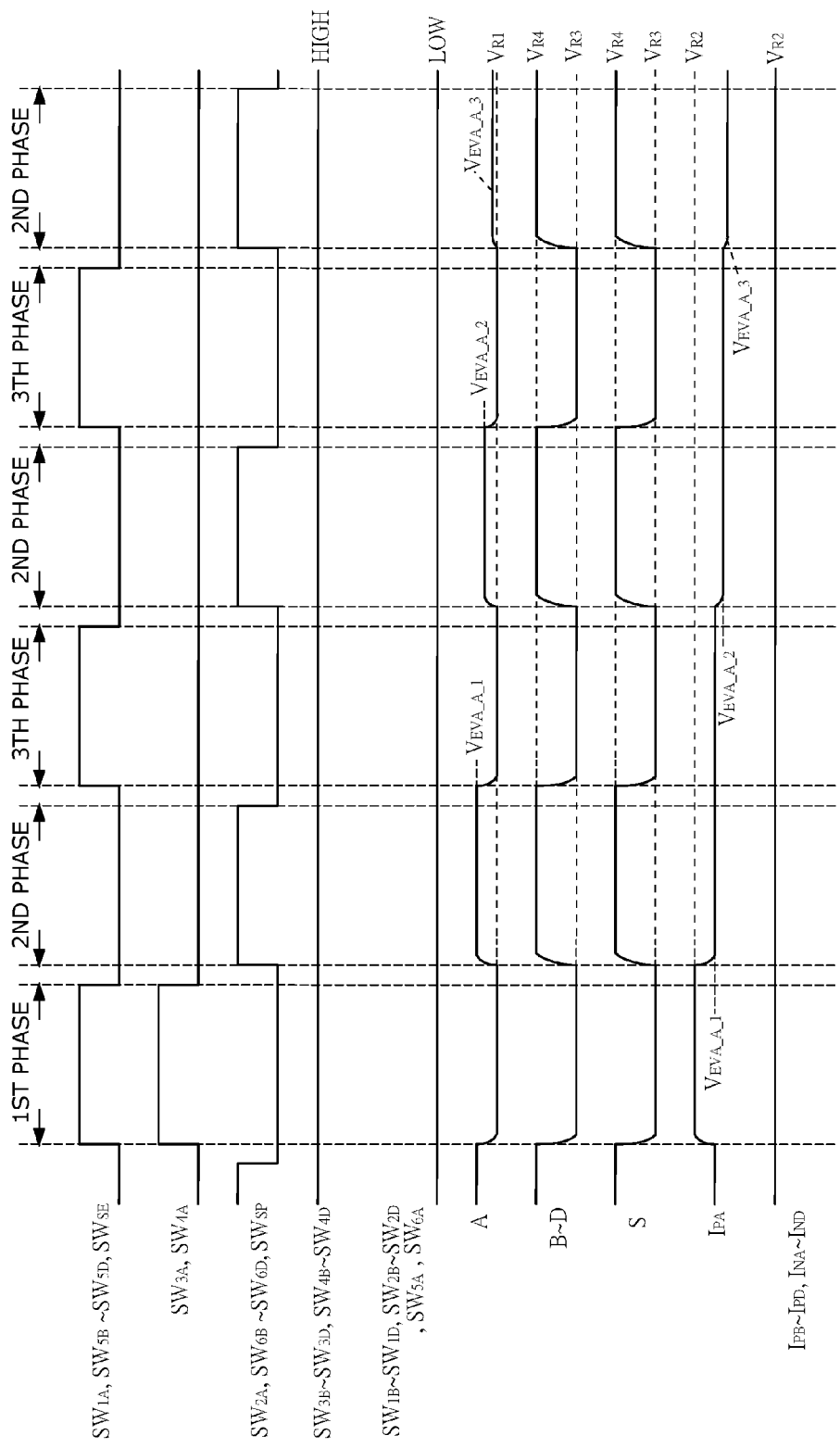
FIG. 9D is a diagram combined a time sequence diagram of each switch and a voltage-variation waveform diagram of each node in FIGS. 9A, 9B and 9C.

In the first phase shown in FIG. 9A, the second phase shown in FIG. 9B and the third phase shown in FIG. 9C, a time sequence of each switch and a voltage variation of each node in an embodiment are shown in FIG. 9D. In a time sequence diagram of each switch, a high voltage level represents that the switch is turned on and a low voltage level represents that the switch is turned off. In this embodiment, the second voltage $V_{R2}$ is larger than the first Voltage $V_{R1}$ and the fourth voltage $V_{R4}$ is larger than the third Voltage $V_{R3}$. From the first phase to the second phase, the first switches $SW_{1A}$, $SW_{SE}$, the fifth switch $SW_{5B}\sim SW_{5D}$, the second $SW_{3A}$ and the fourth switch $SW_{4A}$ are turned off before the third switch $SW_{2A}$, the sixth switch $SW_{6B}\sim SW_{6D}$ and the second switch $SW_{SP}$ are turned on. From the second phase to the third phase, the third switch $SW_{2A}$, the sixth switch $SW_{6B}\sim SW_{6D}$ and the second switch $SW_{SP}$ are turned off before the first switch $SW_{1A}$, $SW_{SE}$ and the fifth switch $SW_{5B}\sim SW_{5D}$ are turned on. From the third phase to the second phase, the first switch $SW_{1A}$, $SW_{SE}$ and the fifth switches $SW_{5B}\sim SW_{5D}$ are turned off before the third switch $SW_{2A}$, the sixth switches $SW_{6B}\sim SW_{6D}$ and the second switch $SW_{SP}$ are turned on. Three voltage levels $V_{EVA\_A\_1}$, $V_{EVA\_A\_2}$ and $V_{EVA\_A\_3}$ respectively represent three electric potentials of a node $I_{P4}$ in the first, second and third phases. As shown in FIG. 9D, after switching between the second and the third phase for several times, the electric potential of the node $I_{P4}$ is decreased.

In the embodiment of FIGS. 8 and 9A to 9C, the fifth switches $SW_{5A}\sim SW_{5D}$ are added to connect to the third voltage $V_{R3}$ and the sixth switches $SW_{6A}\sim SW_{6D}$ are added to connect to the fourth voltage $V_{R4}$. In another embodiment, only the sixth switches $SW_{6A}\sim SW_{6D}$ is connected to the second voltage $V_{R2}$, and the first and sixth switches $SW_{1A}\sim SW_{1D}$, $SW_{6A}\sim SW_{6D}$ are controlled to proceed the operations as the operations of the fifth and sixth switches $SW_{5A}\sim SW_{5D}$, $SW_{6A}\sim SW_{6D}$ in FIGS. 9A to 9C when detecting the electrode plate (Plate A).

In another embodiment of FIG. 2, an isolation electrode plate 521 is formed under each electrode plate 51 to isolate most of the parasitic capacitors between each electrode plates 51 and multiple electric elements below the electrode plate 51. A dielectric layer 503 is formed between the electrode plates 51 and the isolation electrode plates 521 thereof. Using the electrode plate (Plate A) as an example, the capacitance of the parasitic capacitor between the node A and the other conductor thereof is decreased to a small capacitor $C_{p1a'}$, and another capacitor $C_{qa}$ represents a capacitor between the isolation electrode plate 521 and the electrode plate (Plate A).

Figure 2:
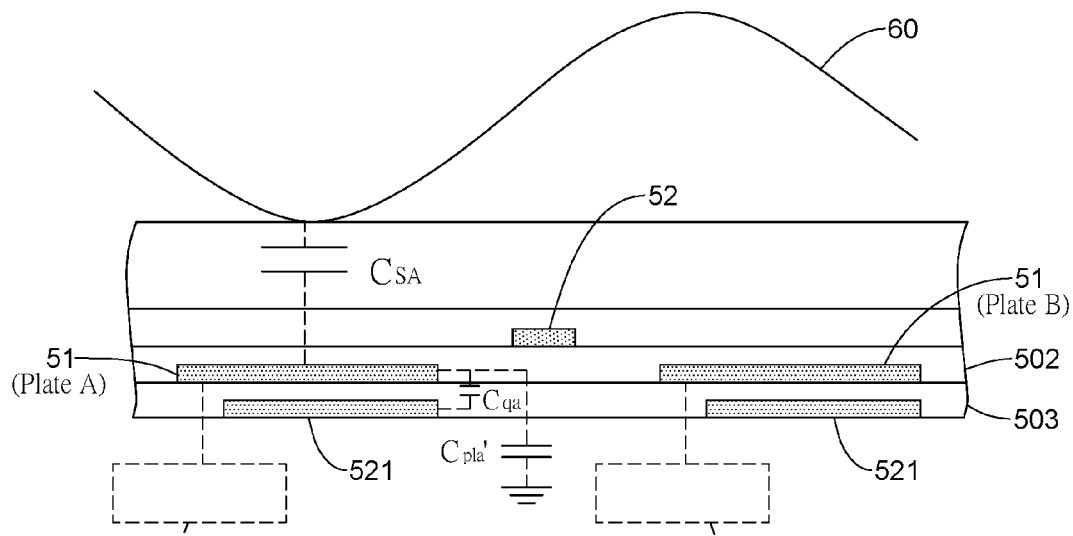
FIG. 2 is another schematic view of a partial structure of a fingerprint sensor and a sensing circuit thereof in accordance with the present invention.
Figure 11A:
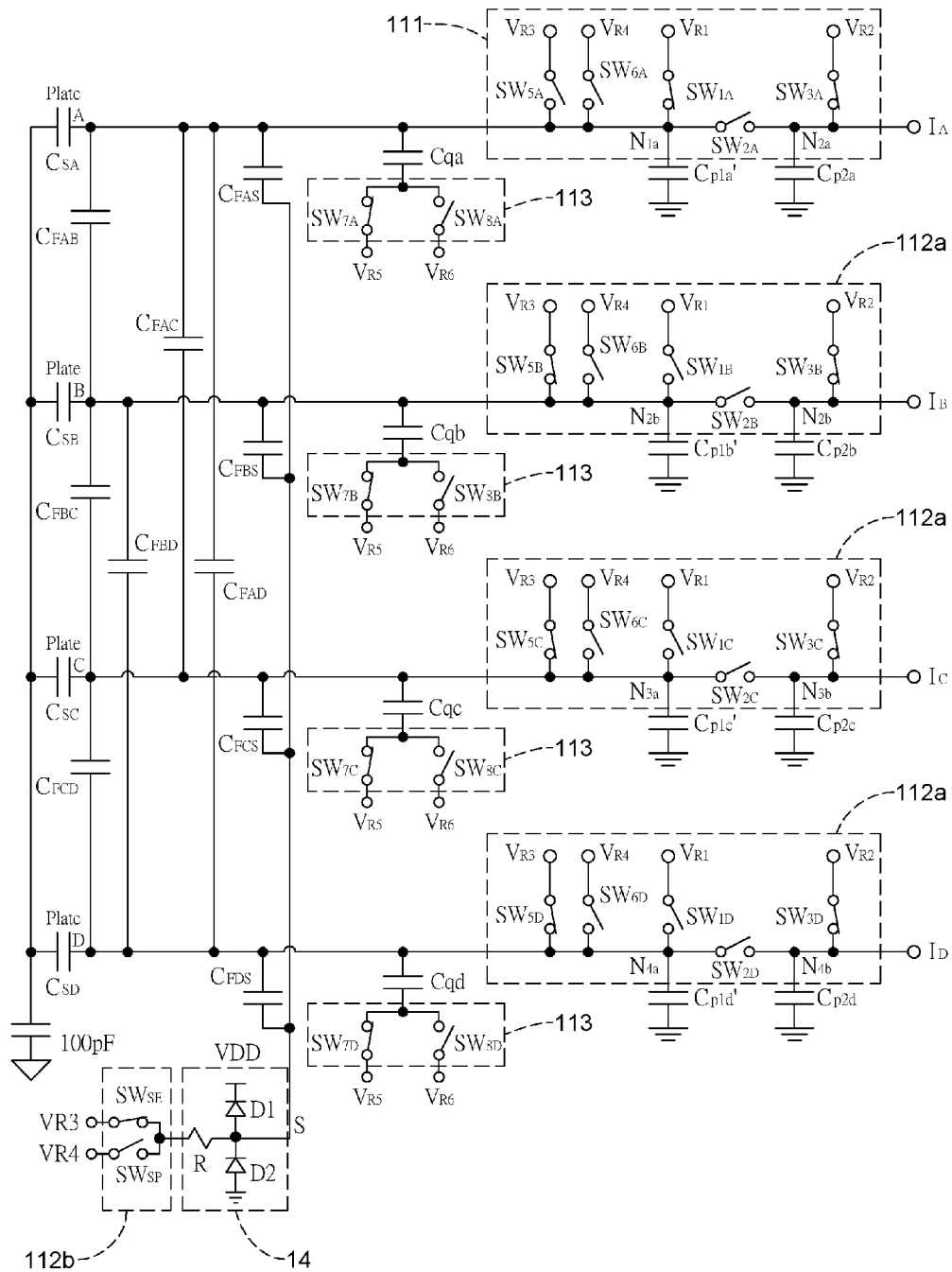
FIGS. 11A to 11C are three different circuit diagrams of the sensing circuit of FIG. 2 respective in first to third phases.

An embodiment of FIG. 11A is applied to the structure of FIG. 2 and further has a third switching unit 113 connected to the isolation electrode plate 521. The third switching unit 113 is used to connect isolation electrode plate 521 to a fifth voltage $V_{R5}$ or a sixth voltage $V_{R6}$. Each third switching unit 113 has a seventh and eighth switches. The seventh switches $SW_{7A}$~$SW_{7D}$ are coupled between the fifth voltage $V_{R5}$ and the isolation electrode plates 521, and the eighth switches $SW_{8A}$~$SW_{8D}$ are coupled between the sixth voltage $V_{R6}$ and the isolation electrode plates 521. The fifth and sixth voltages $V_{R5}$, $V_{R6}$ are different and the fifth voltage $V_{R5}$ may be the same as or may be different from the first voltage $V_{R1}$, and the sixth voltage $V_{R6}$ may be the same as or may be different from the second voltage $V_{R2}$. In an embodiment, a difference calculated by subtracting the sixth voltage $V_{R6}$ from the fifth voltage $V_{R5}$ is equal to the difference calculated by subtracting the second voltage $V_{R2}$ from the first voltage $V_{R1}$ ($V_{R5}-V_{R6}=V_{R1}-V_{R2}$).

Figure 11B:
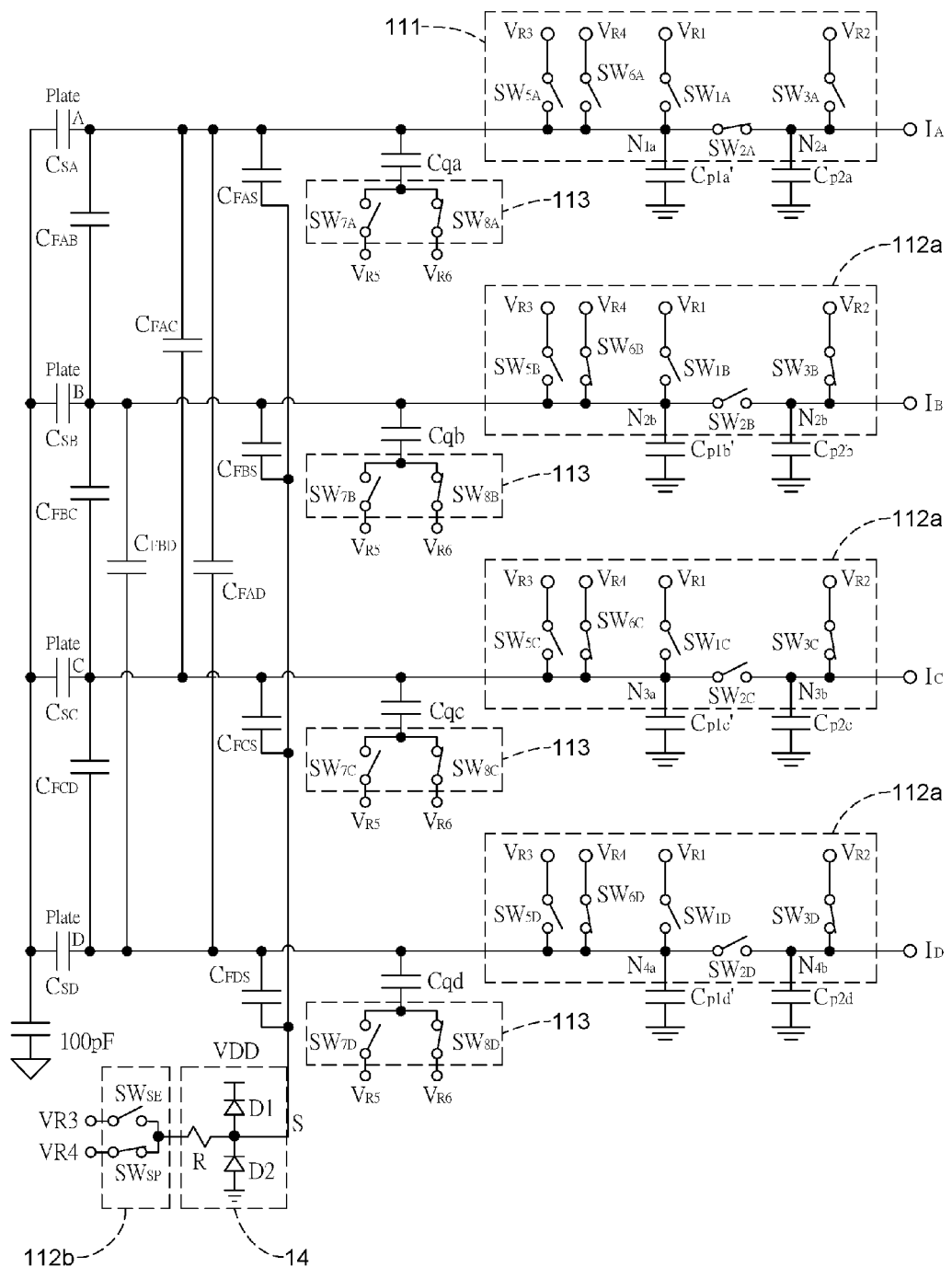

In the first phase, the status of each switch of the first and second switching units 111 and 112a are the same with those in FIG. 9A. The seventh switches $SW_{7A}$~$SW_{7D}$ are turned on and the eighth switches $SW_{8A}$~$SW_{8D}$ are turned off, so as to connect each isolation electrode plate 521 to the fifth voltage $V_{R5}$. An operation of the second phase is shown in FIG. 11B. A control of first and second switching units 111 and 112a is the same as that of FIG. 9B. The seventh switches $SW_{7A}$~$SW_{7D}$ are turned off and the eighth switches $SW_{8A}$~$SW_{8D}$ are turned on to connect each isolation electrode plate 521 to the sixth voltage $V_{R6}$. In another embodiment, at least the seventh switches $SW_{7A}$ and the eighth switch $SW_{8A}$ connected to the isolation electrode plate 521 under the electrode plate (Plate A) are controlled to perform the foregoing operations. In the second phase, the measurement result of the electrode plate (Plate A) is read out, or an operation of FIG. 11C may be further proceeded to.

Figure 11C:
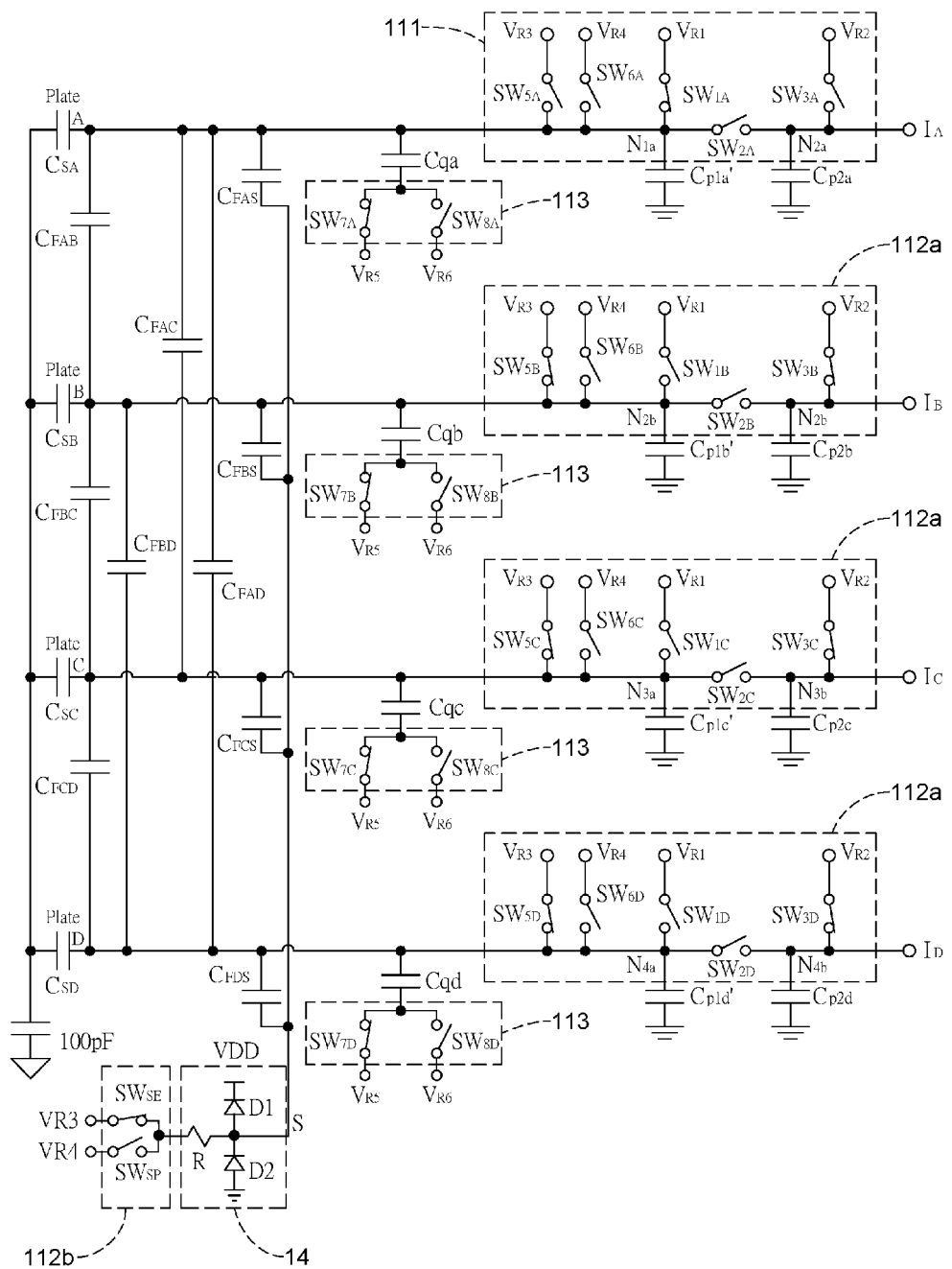

In FIG. 11C, a control of the first and second switching units 111 and 112a is the same with those in FIG. 9C. The seventh switch $SW_{7A}$~$SW_{7D}$ are turned on and the eighth switches $SW_{8A}$~$SW_{8D}$ are turned off, so as to connect each isolation electrode plate 521 to the fifth voltage $V_{R5}$. After such the third phase of FIG. 11C and the second phase of FIG. 11B are repeated for several times, an output voltage $V_{OA}$ is read out in a final second phase of FIG. 11B. At this time, a voltage $V_{P2}$ of the second node $N_{2a}$ is: $V_{P2}=\{[C_{SA}\times(V_{R1}-V_{R2})]/C_T+[C_{FPPA}\times(V_{R1}-V_{R2}-V_{R3}+V_4)]/C_T+[C_{FAS}\times(V_{R1}-V_{R2}-V_{R3}+V_{R4})]/C_T+[C_{p1a}'\times(V_{R1}-V_{R2})]/C_T+$ $$[C_{qa}\times(V_{R1}-V_{R2}-V_{R5}+V_{R6})]/C_T\}\times\left(\sum_{i=1}^{n}x^{i-1}\right)+V_{R2}.$$

When the difference calculated by subtracting the fourth voltage $V_{R4}$ from the third voltage $V_{R3}$ is equal to the difference calculated by subtracting the second voltage $V_{R2}$ from the first voltage $V_{R1}$ ($V_{R3}-V_{R4}=V_{R1}-V_{R2}$), and the difference calculated by subtracting the sixth voltage $V_{R6}$ from the fifth voltage $V_{R5}$ is equal to the difference calculated by subtracting the second voltage $V_{R2}$ from the first voltage $V_{R1}$ ($V_{R5}-V_{R6}=V_{R1}-V_{R2}$), the foregoing equation is calculated to $$V_{P2}=\{[C_{SA}\times(V_{R1}-V_{R2})]/C_T+[C'_{p1a}\times(V_{R1}-V_{R2})]/C_T+\}\times\left(\sum_{i=1}^{n}x^{i-1}\right)+V_{R2},$$

wherein $C_T=C_{SA}+C_{FPPA}+C_{FAS}+C_{p1a}'+C_{p2a}+C_{qa}$, $x=C_{p2a}/C_T$ and n represents the number of switching times between the second phase and the third phase.

Based on the foregoing description, the parasitic capacitors $C_{p1a}$~$C_{p1d}$ is decreased to the small parasitic capacitors $C_{p1a'}$~$C_{p1d'}$, and a common mode voltage level caused by the small parasitic capacitors $C_{p1a'}$~$C_{P1D'}$ is relatively decreased. The effects caused by the capacitors formed between the isolation electrode plates 521 and the electrode plates 51 are decreased to a minimum condition by switching the isolation electrode plates 521 to fifth or sixth voltage $V_{R5}$, $V_{R6}$.

Figure 11D:
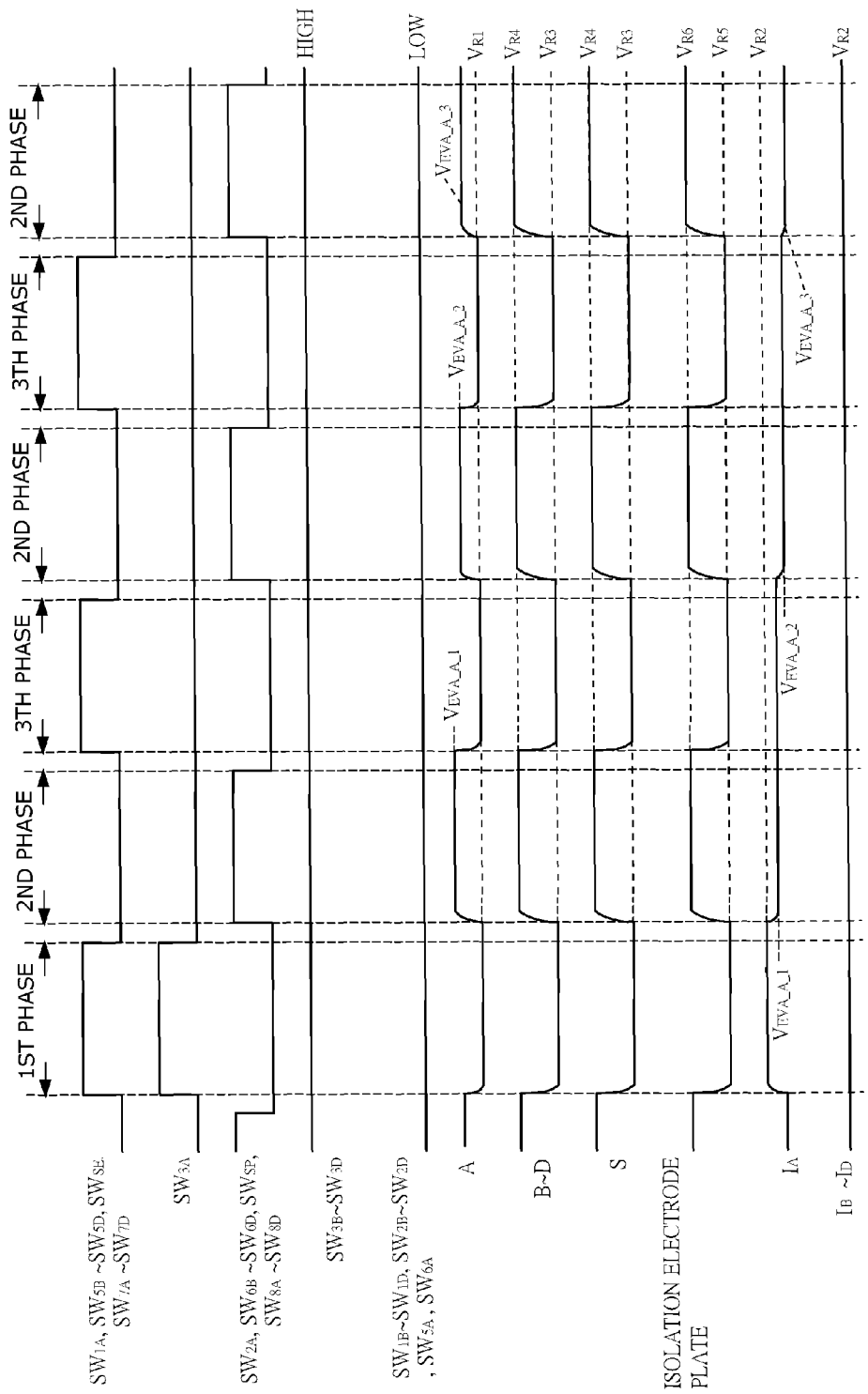
FIG. 11D is a diagram combined a time sequence diagram of each switch and a voltage-variation waveform diagram of each node in FIGS. 11A, 11B and 11C.

In the first phase shown in FIG. 11A, the second phase shown in FIG. 11 and the third phase shown in FIG. 11C, a time sequence of each switch and a voltage variation of each node in an embodiment are shown in FIG. 11D. In a time sequence diagram of each switch, a high voltage level represents that the switch is turned on and a low voltage level represents that the switch is turned off. In this embodiment, the second voltage $V_{R2}$ is larger than the first voltage $V_{R1}$, and the fourth voltage $V_{R4}$ is larger than the third Voltage $V_{R3}$ and the sixth voltage $V_{R6}$ is larger than the fifth Voltage $V_{R5}$. From the first phase to the second phase, the first switches $SW_{1A}$, $SW_{SE}$, the fifth switches $SW_{5B}$~$SW_{5D}$, the seventh switches $SW_{7A}$~$SW_{7D}$ and the second switch $SW_{3A}$ are turned on before the third switch $SW_{2A}$, the sixth switch $SW_{6B}$~$SW_{6D}$ and the second switch $SW_{SP}$ and the eighth switches $SW_{8A}$~$SW_{8D}$ are turned off. From the second phase to the third phase, the third switch $SW_{2A}$, the sixth switches $SW_{6B}$~$SW_{6D}$ and the second switch $SW_{SP}$ and the eighth switches $SW_{8A}$~$SW_{8D}$ are turned off before the first switch $SW_{1A}$, $SW_{SE}$, the fifth switch $SW_{5B}$~$SW_{5D}$ and the seventh switches $SW_{7A}$~$SW_{7D}$ are turned on. From the third phase to the second phase, the first switch $SW_{1A}$, $SW_{SE}$, the fifth switches $SW_{5B}$~$SW_{5D}$ and the seventh switches $SW_{7A}$~$SW_{7D}$ are turned off before the third switch $SW_{2A}$, the sixth switches $SW_{6B}$~$SW_{6D}$, the second switch $SW_{SP}$ and eighth switches $SW_{8A}$~$SW_{8D}$ are turned on. The three electric potentials $V_{EVA\_A\_1}$, $V_{EVA\_A\_2}$ and $V_{EVA\_A\_3}$ respectively represent three electric potentials of the node $I_{PA}$ in the first, second and third phases. As shown in FIG. 11D, after switching between the second and the third phases for several times, the electric potential of the node $I_{PA}$ is decreased.

Figure 10B:
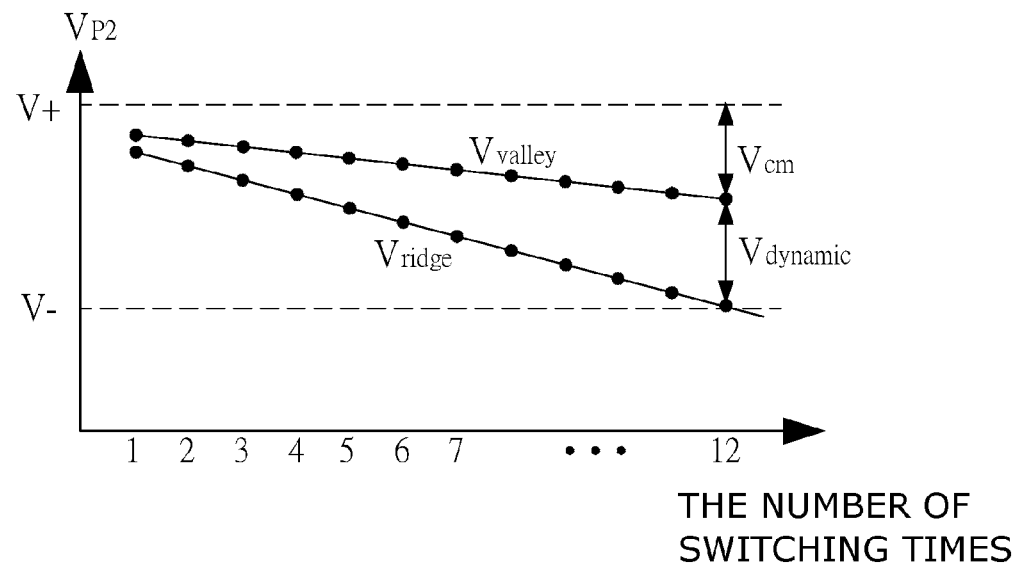
FIG. 10B is another diagram of dynamic voltage range and switching number in accordance with the present invention.

The relationship of the switching times between FIGS. 11C and 11B and the voltage $V_{P2}$ of the second node $N_{2a}$ is shown in FIG. 10B. With comparison with FIG. 10A, since a voltage level of the common mode voltage $V_{OCM}$ is decreased, the numbers of switching times can be increased as in FIG. 10B. Thus a larger voltage dynamic range $V_{dynamic}$ can be obtained between a maximal operation voltage V+ and a minimal operation voltage V− of the circuit.

In another embodiment, the difference between the first and second voltage $V_{R1}$, $V_{R2}$ is increased, for example by using a larger voltage as the first voltage $V_{R1}$. This arrangement can increase the voltage dynamic range $V_{dynamic}$. In this embodiment, the first voltage $V_{R1}$ is larger than the second voltage $V_{R2}$, the fifth voltage $V_{R5}$ is larger than the sixth voltage $V_{R6}$, and the difference calculated by subtracting the fourth voltage $V_{R6}$ from the third voltage $V_{R5}$ is larger to the difference calculated by subtracting the second voltage $V_{R2}$ from the first voltage $V_{R1}$ [$(V_{R5}-V_{R6})>(V_{R1}-V_{R2})$]. The first voltage $V_{R1}$ is a high voltage (ex. 15V), the second voltage $V_{R2}$ is a low voltage (ex. 1V), the fifth voltage $V_{R5}$ is another high voltage (ex. 18V) and the sixth voltage $V_{R6}$ is another low voltage (ex. 0V). In any phase, an input voltage of the read-out circuit 13 falls in an operative voltage range of low voltage elements. That means, the read-out circuit 13 can be manufactured without a high voltage element manufacturing process, thus a chip size and power consumption can be saved accordingly. If the second voltage $V_{R2}$ is a high voltage and the first voltage $V_{R1}$ is a low voltage, the read-out circuit 13 has to be manufactured by the high voltage element manufacturing process. Since a size of the high voltage element is larger than that of the low voltage element, the size of the read-out circuit will be increased. In another aspect, if the read-out circuit is manufactured by the high voltage element manufacturing process, a high voltage source has to be provided to the read-out circuit 13 so that a size and a power consumption of a voltage doubler is added.

In the embodiment of using the larger voltage as the first voltage $V_{R1}$, the difference between the third and fourth voltages VR3, VR4 may be increased to increase the voltage dynamic range $V_{dynamic}$. In such arrangement, the third voltage $V_{R3}$ is larger than the fourth voltage $VR_4$ and the difference between the third and fourth voltages $V_{R3}$, $V_{R4}$ is larger than that between the first and second voltages $V_{R1}$, $V_{R2}$ [$(V_{R3}-V_{R4})>(V_{R1}-V_{R2})$].

In other embodiments, multiple electrode plates are detected at the same time. That means that sensing signals of the multiple electrode plates to be measured are read at the same time. For example, the sensing signals of the electrode plates located on the first rows are read at the same time and other electrode plates on other rows are not read.

Each embodiment mentioned above only uses the four electrode plates as an example. In the above embodiments, in addition to the switching unit connected to the electrode plate to be measured, the switching units corresponding to other three adjacent electrode plates are controlled to perform the same operations. In other embodiments, at least one switching unit corresponding to an electrode plate adjacent to the electrode plate to be measured performs the operations. Alternatively, in addition to the switching unit connected to the electrode plate to be measure, the switching units coupling to all of the other electrode plates may perform the same operations. In another embodiment, the multiple electrode plates to be measured are detected at the same time and the switching units coupling to other electrode plates adjacent the multiple electrode plates to be measured perform the same operations.

In the different embodiments, the difference calculated by subtracting the fourth voltage $V_{R4}$ from the third voltage $V_{R3}$ may be larger or smaller than the difference calculated by subtracting the second voltage $V_{R2}$ from the first voltage $V_{R1}$. In the foregoing embodiments, the difference calculated by subtracting the sixth voltage $V_{R6}$ from the fifth voltage $V_{R5}$ may be larger or smaller than the difference calculated by subtracting the second voltage $V_{R2}$ from the first voltage $V_{R1}$. Furthermore, in the foregoing description, when the first voltage $V_{R1}$ is larger than the second voltage $V_{R2}$, the third voltage $V_{R3}$ is larger than the fourth voltage $V_{R4}$ and the fifth voltage $V_{R5}$ is larger than the sixth voltage $V_{R6}$. When the first voltage $V_{R1}$ is smaller than the second voltage $V_{R2}$, the third voltage $V_{R3}$ is smaller the fourth voltage $V_{R4}$ and the fifth voltage $V_{R5}$ is smaller than the sixth voltage $V_{R6}$.

Based on the foregoing description, in a first phase of a sensing method in accordance with the present invention, the first voltage is supplied to the first node connected to the electrode plate to be measured, the second voltage is supplied to the second node connected to the read-out circuit and the third voltage is supplied to the third node connected to a conductor adjacent to the electrode plate to be measured, wherein the first voltage minus the second voltage leaves a non-zero value. In a second phase, the first, second and third voltages are stopped supplying to the first, second and third nodes and a fourth voltage is supplied to the third node, the first node is connected to the second node and the read-out circuit outputs the measurement result of the electrode plate to be measured. In the embodiment, the difference calculated by subtracting the fourth voltage $V_{R4}$ from the third voltage $V_{R3}$ is equal to the difference calculated by subtracting the second voltage $V_{R2}$ from the first voltage $V_{R1}$. The third voltage may be the first voltage and the fourth voltage may be the second voltage, or the difference calculated by subtracting the fourth voltage from the third voltage may be larger or smaller than the difference calculated by subtracting the second voltage from the first voltage.

Based on the foregoing description, in the sensing method and circuit in accordance with the present invention, the conductor adjacent to the electrode plate to be measured is connected to the third and fourth voltages with different electric potentials in the first and second phases, rather than connected to a fixed electric potential of the voltage. Thus, when reading the measurement result in the second phase, the defect that the fringe capacitor formed between the electrode plate and the adjacent conductor counteracts a part of sensing signal of the electrode plate to be measured will be improved. Therefore, larger signal value of the measurement result is obtained, and the valley part or ridge part of the fingerprint can be identified accurately.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A sensing method of a fingerprint sensor to sense an electrode plate to be measured of the fingerprint sensor, comprising steps of:
   (a) in a first phase, supplying a first voltage to a first node connected to the electrode plate to be measured, supplying a second voltage to a second node, and supplying a third voltage to a conductor adjacent to the electrode plate to be measured, wherein the first voltage minus the second voltage leaves a non-zero value and the first voltage is larger or smaller than the second voltage; and
   (b) in a second phase, stopping supplying the first, second and third voltages to the first, second and third nodes, supplying a fourth voltage to the conductor, connecting the first node to the second node, wherein a voltage of the second node corresponds to a measurement result of the electrode plate to be measured, wherein when the first voltage is larger than the second voltage and the third voltage is larger than the fourth voltage, or when the first voltage is smaller than the second voltage and the third voltage is smaller than the fourth voltage.

2. The sensing method as claimed in claim 1, wherein a difference calculated by subtracting the fourth voltage from the third voltage is equal, larger or smaller than a difference calculated by subtracting the second voltage from the first voltage.

3. The sensing method as claimed in claim 2, wherein the first voltage is equal to the third voltage and the second voltage is equal to the forth voltage.

4. The sensing method as claimed in claim 1, further comprising steps of:
   (c) in a third phase, supplying the first voltage to the first node and supplying the third voltage to the conductor; and
   (d) returning to the second phase.

5. The sensing method as claimed in claim 1, wherein the conductor is a first electrode plate adjacent to the electrode plate to be measured, and the first electrode plate is used to sense a fingerprint.

6. The sensing method as claimed in claim 1, wherein
   in the first phase, the third voltage is further supplied to multiple second electrode plates; and
   in the second phase, the fourth voltage is further supplied to the second electrode plates, wherein the second electrode plate is used to sense a fingerprint.

7. The sensing method as claimed in claim 1, wherein the conductor is a protection electrode adjacent to the electrode plate to be measured and the protect electrode is used to provide an electrostatic discharge protection.

8. The sensing method as claimed in claim 4, wherein the conductor is a protection electrode adjacent to the electrode plate to be measured and the protect electrode is used to provide an electrostatic discharge protection.

9. The sensing method as claimed in claim 1, wherein
   in the step (a), a fifth voltage is supplied to an isolation electrode plate and the isolation electrode plate is formed under the electrode plate to be measured; and
   in the step (b), the fifth voltage is stopped supplying and a sixth voltage is supplied to the isolation electrode plate.

10. The sensing method as claimed in claim 9, wherein a difference calculated by subtracting the sixth voltage from the fifth voltage is equal, larger or smaller than a difference calculated by subtracting the second voltage from the first voltage.

11. The sensing method as claimed in claim 4, wherein
    in the step (a), a fifth voltage is supplied to an isolation electrode plate and the isolation electrode plate is formed under the electrode plate to be measured; and
    in the step (b), the fifth voltage is stopped supplying and a sixth voltage is supplied to the isolation electrode plate.

12. The sensing method as claimed in claim 11, wherein a difference calculated by subtracting the sixth voltage from the fifth voltage is equal, larger or smaller than a difference calculated by subtracting the second voltage from the first voltage.

13. A sensing circuit to sense an electrode plate to be measured of a fingerprint sensor, comprising:
    a read-out circuit to read out a measurement result of the electrode plate to be measured;
    a first switching unit coupled to a first voltage and a second voltage and having a first node connected to the electrode plate to be measured and a second node connected to the read-out circuit, wherein the first voltage minus the second voltage leaves a non-zero value and the first voltage is larger or smaller than the second voltage;
    a second switching unit to connect a conductor to a third voltage or a fourth voltage, wherein the third voltage minus the fourth voltage leaves a non-zero value and when the first voltage is larger than the second voltage and the third voltage is larger than the fourth voltage, or when the first voltage is smaller than the second voltage and the third voltage is smaller than the fourth voltage;
    a control unit controlling the first and second switching units, wherein
    in a first phase, the control unit controls the first and second units to connect the first node to the first voltage, to connect the second node to the second voltage, to disconnect the first node to the second node, and to connect the conductor to the third voltage;
    in a second phase, the control unit controls the first and second switching units to respectively disconnected the first, second and third nodes to the first, second and third voltages, to connect the first node to the second node, and to control the second switching unit to couple the conductor to the fourth voltage.

14. The sensing circuit as claimed in claim 13, wherein a difference calculated by subtracting the fourth voltage from the third voltage is equal, larger or smaller than a difference calculated by subtracting the second voltage from the first voltage.

15. The sensing circuit as claimed in claim 13, wherein after the second phase, in a third phase, the control unit controls the first and second switching units to couple the first node to the first voltage, to disconnect the first node to the second node, and to connect the conductor to the third voltage and after the third phase the control unit performs the same control as in the second phase.

16. The sensing circuit as claimed in claim 13, wherein the first switching unit comprises:
    a first switch to couple the first voltage to the first node;
    a second switch to couple the second voltage to the second node; and
    a third switch between the first and second nodes; wherein
    in the first phase, the first and second switches are turned on and the third switch is turned off; and
    in the second phase, the first and second switches are turned off and the third switch is turned on.

17. The sensing circuit as claimed in claim 13, wherein the second switching unit comprises:
    a fourth switch to couple the third voltage to the conductor; and
    a fifth switch to couple the fourth voltage to the conductor; wherein
    in the first phase, the fourth switch is turned on and the fifth switch is turned off; and
    in the second phase, the fourth switch is turned off and the fifth switch is turned on.

18. The sensing circuit as claimed in claim 13, wherein the first voltage is equal to the third voltage and the second voltage is equal to the fourth voltage.

19. The sensing circuit as claimed in claim 13, wherein the conductor is a first electrode plate adjacent to the electrode plate to be measured and the first electrode plate is used to sense a fingerprint.

20. The sensing circuit as claimed in claim 13, wherein the fingerprint sensor further comprises multiple second electrode plates to sense a fingerprint and the sensing circuit further comprises:

multiple third switching units to respectively connect the second electrode plates to the third voltage or the fourth voltage, wherein in the first phase, the control unit controls the third switching units to couple the second electrode plates to the third voltage; and in the second phase, the control unit controls the third switching units to couple the second electrode plates to the fourth voltage.

21. The sensing circuit as claimed in claim 20, wherein the third switching unit further comprises:
a sixth switch to couple to the first voltage to the second electrode plate; and
a seventh switch to couple to the fourth voltage to the second electrode plate; wherein
in the first phase, the sixth switch is turned on and the seventh switch is turned off; and
in the second phase, the sixth switch is turned off and the seventh switch is turned on.

22. The sensing circuit as claimed in claim 13, wherein the conductor is a protection electrode adjacent to the electrode plate to be measured and the protect electrode is used to provide an electrostatic discharge protection.

23. The sensing circuit as claimed in claim 22, further comprising an electrostatic discharge (ESD) protection circuit coupled between the protection electrode and the second switching unit.

24. The sensing circuit as claimed in claim 23, wherein the ESD protection circuit comprises:
a first diode having an anode connected to the protection electrode and a cathode connected to a voltage with a high electric potential;
a second diode having a cathode connected to the anode of the first diode and the protection electrode, and an anode of the second diode connected to ground; and
a resistor element having a node connected to a connection node of the first and second diodes, and another node connected to the second switching unit.

25. The sensing circuit as claimed in claim 13, wherein the read-out circuit has a buffer having a single input connected to the second node.

26. The sensing circuit as claimed in claim 13, wherein the read-out circuit comprises:
a differential circuit having a non-inverting input connected to the second node and an output connected to the control unit; and
a grounded capacitor connected to an inverting input of the differential circuit and coupled to the second voltage through a eighth switch, wherein
in the first phase, the eighth switch is turned on; and
in the second phase, the eighth switch is turned off.

27. The sensing circuit as claimed in claim 16, wherein the read-out circuit comprises:
a differential circuit having a non-inverting input connected to the second node and an output connected to the control unit; and
a grounded capacitor connected to an inverting input of the differential circuit and coupled to the second voltage through a eighth switch, wherein
in the first phase, the eighth switch is turned on; and
in the second phase, the eighth switch is turned off.

28. The sensing circuit as claimed in claim 13, the read-out circuit comprises:
a differential circuit having a non-inverting input connected to the second node, an output connected to the control unit and an inverting input connected to a reference voltage, and the reference voltage is equal to the second voltage.

29. The sensing circuit as claimed in claim 13, wherein
in the first phase, the control unit further supplies a fifth voltage to an isolation electrode plate, wherein the isolation electrode plate is formed under the electrode plate to be measured; and
in the second phase, the control unit further stops supplying the fifth voltage and supplies a sixth voltage to the isolation electrode plate, wherein the fifth voltage minus the sixth voltage leaves a non-zero value.

30. The sensing circuit as claimed in claim 29, wherein a difference calculated by subtracting the sixth voltage from the fifth voltage is equal, larger or smaller than the difference calculated by subtracting the second voltage from the first voltage, or when the first voltage is smaller than the second voltage, the fifth voltage is smaller than the sixth voltage.

31. The sensing circuit as claimed in claim 29, further comprising a fourth switching unit comprising:
a ninth switch to couple the fifth voltage to the isolation electrode plate; and
a tenth switch to couple the sixth voltage to the isolation electrode plate; wherein
in the first phase, the ninth switch is turned on and the tenth switch turned off; and
in the second phase, the ninth switch is turned off and tenth switch turned on.

32. The sensing circuit as claimed in claim 15, wherein
in the first phase, the control unit further supplies a fifth voltage to an isolation electrode plate, wherein the isolation electrode plate is formed under the electrode plate to be measured; and
in the second phase, the control unit further stops supplying the fifth voltage and supplies a sixth voltage to the isolation electrode plate, wherein the fifth voltage minus the sixth voltage leaves a non-zero value.

33. The sensing circuit as claimed in claim 32, wherein a difference calculated by subtracting the sixth voltage from the fifth voltage is equal, larger or smaller than the difference calculated by subtracting the second voltage from the first voltage, or when the first voltage is smaller than the second voltage, the fifth voltage is smaller than the sixth voltage.

34. The sensing circuit as claimed in claim 32, further a fourth switching unit comprising:
a ninth switch to couple the fifth voltage to the isolation electrode plate;
a tenth switch to couple the sixth voltage to the isolation electrode plate; wherein
in the first phase, the ninth switch is turned on and the tenth switch turned off; and
in the second phase, the ninth switch is turned off and tenth switch turned on.

* * * * *